United States Patent [19]

Powers et al.

[11] Patent Number: 5,684,571
[45] Date of Patent: Nov. 4, 1997

[54] APPARATUS FOR AND METHOD OF EXPOSING PHOTOSENSITIZED PLATES

[75] Inventors: John W. Powers, Springfield; Daniel G. Choate, Everton, both of Mo.

[73] Assignee: Western Litho Plate & Supply Co., St. Louis, Mo.

[21] Appl. No.: 461,659

[22] Filed: Jun. 5, 1995

[51] Int. Cl.$^6$ .................................................. G03B 27/04
[52] U.S. Cl. ........................................ 355/99; 355/85
[58] Field of Search ................................. 355/85, 99

[56] References Cited

U.S. PATENT DOCUMENTS

| | | | |
|---|---|---|---|
| 4,423,955 | 1/1984 | Powers | 355/99 |
| 4,931,833 | 6/1990 | Elwing | 355/85 |
| 4,951,089 | 8/1990 | Powers | 355/85 |
| 5,124,745 | 6/1992 | Fischer et al. | 355/85 |
| 5,369,468 | 11/1994 | Powers et al. | 355/99 |
| 5,390,001 | 2/1995 | Ishiwata et al. | 355/85 |

OTHER PUBLICATIONS

K&F Printing Systems Int'l. entitled Plate Express II Copyright 1992, 4 pages.

K&F Printing Systems Int'l. entitled Now, There's An Alternative, from News & Tech dated Jun. 1991, 1 page.

*Primary Examiner*—Fred L. Braun
*Attorney, Agent, or Firm*—Senniger, Powers, Leavitt & Roedel

[57] ABSTRACT

Apparatus for exposing photosensitized plates to light through films. The apparatus has an infeed end, an outfeed end forward of the infeed end, opposite sides, an exposure station forward of the infeed end at which a plate is exposed to light through a film, and a carriage for carrying plates and films in a forward direction from a loading station at the infeed end of the machine to the exposure station. The apparatus includes a support for supporting a stack of plates at one side of the apparatus generally adjacent the infeed end of the apparatus. A conveyor system conveys a plate in side-to-side direction with respect to the apparatus from the one side of the apparatus to the loading station. A transfer mechanism removes a top plate from the stack of plates and transfers it to the conveyor system for conveyance to the loading station.

25 Claims, 16 Drawing Sheets

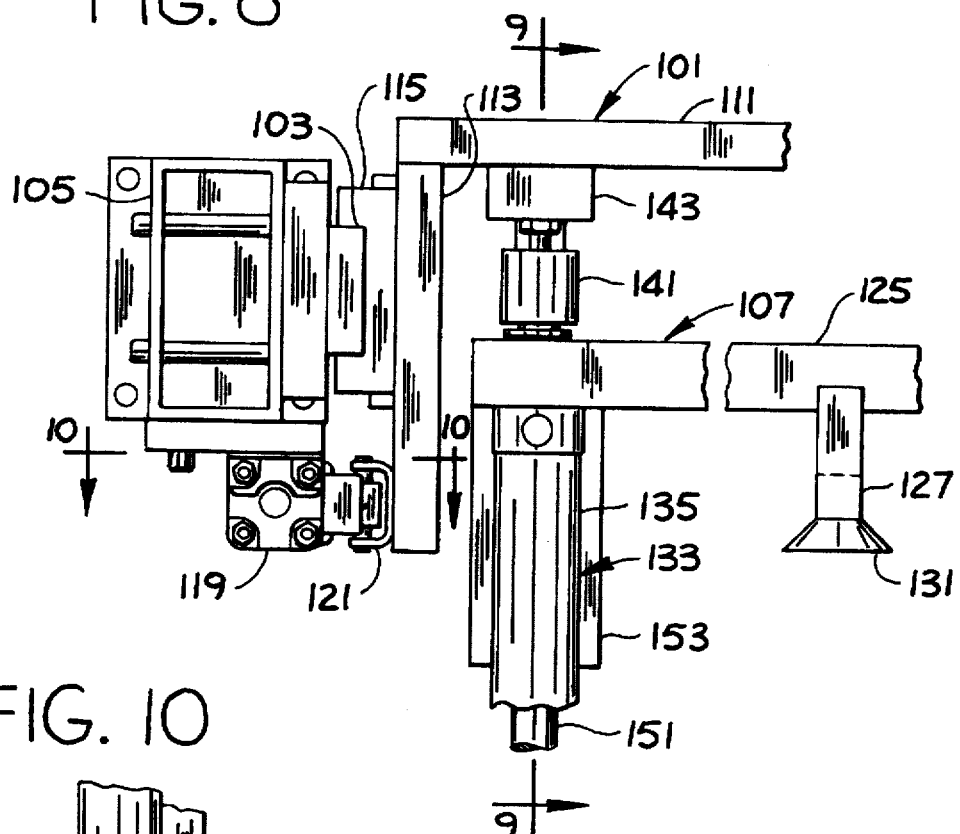
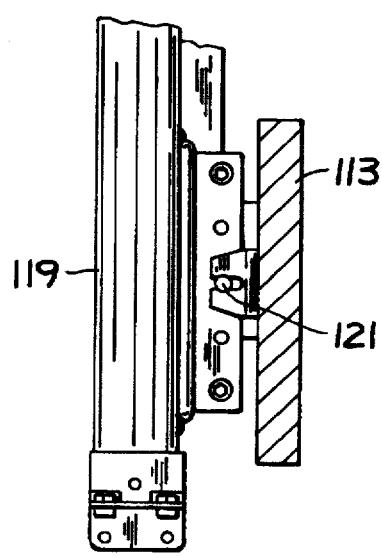
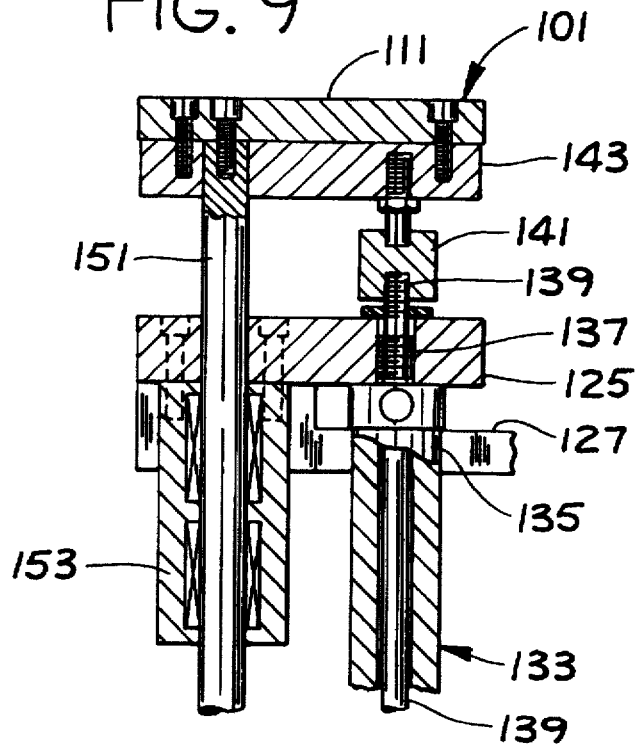

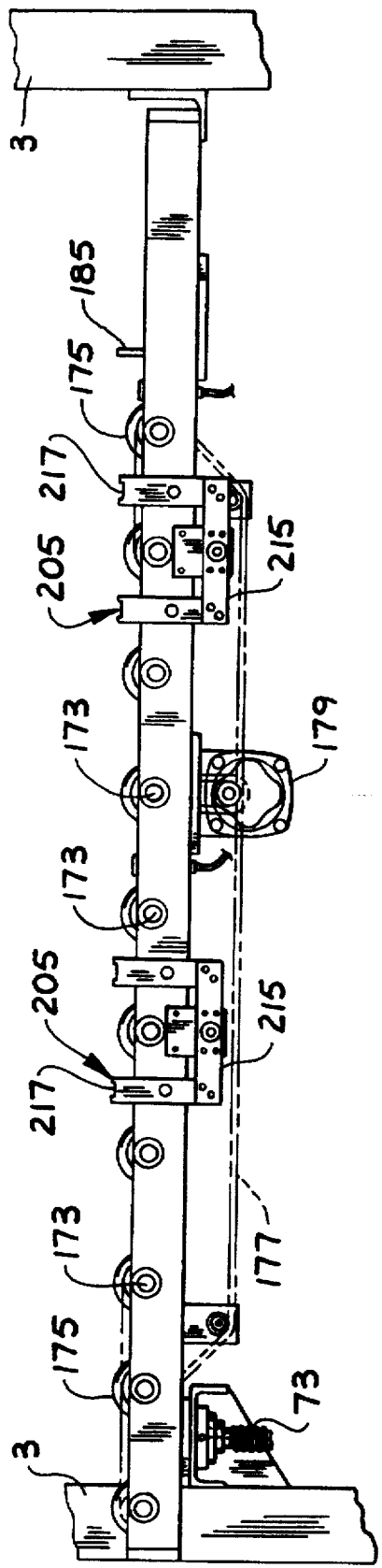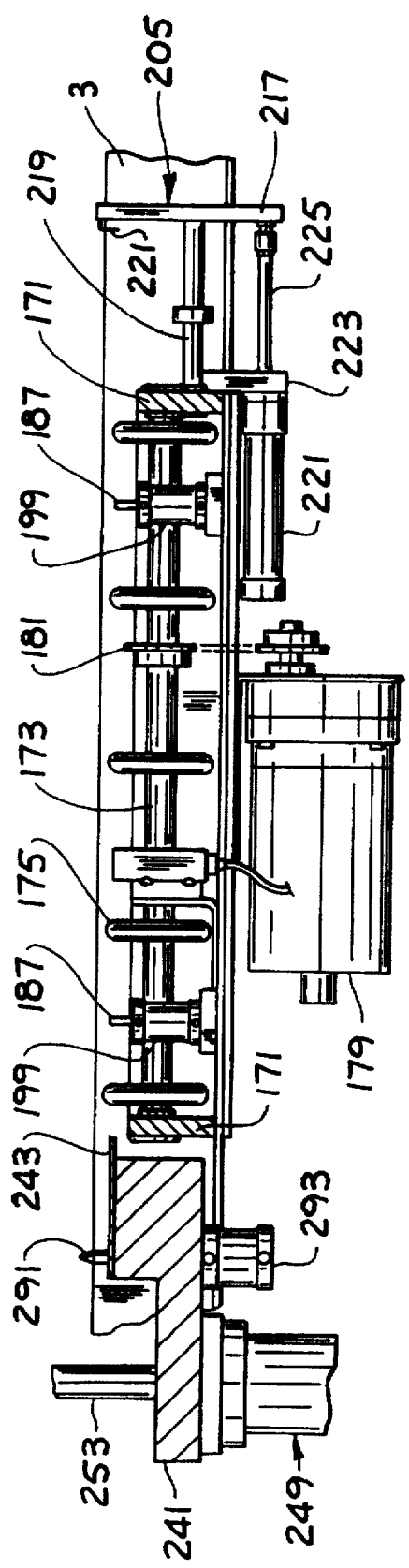

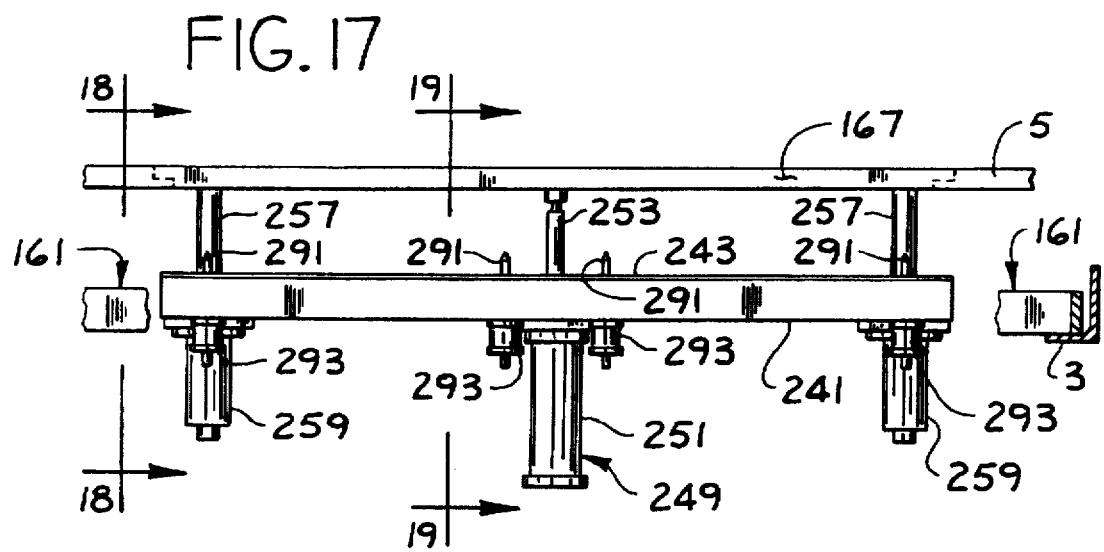
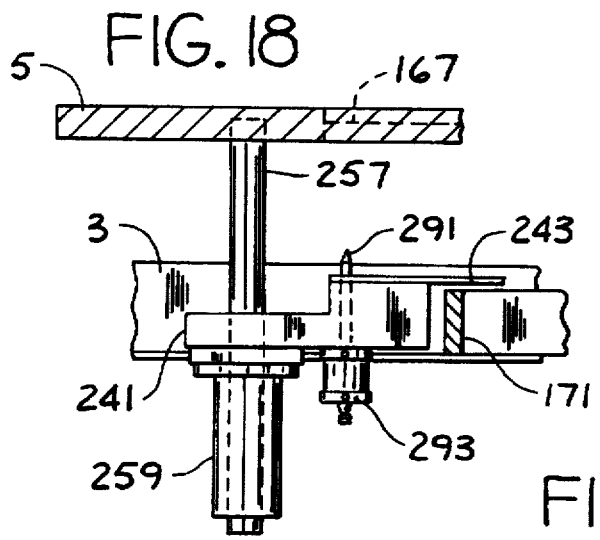
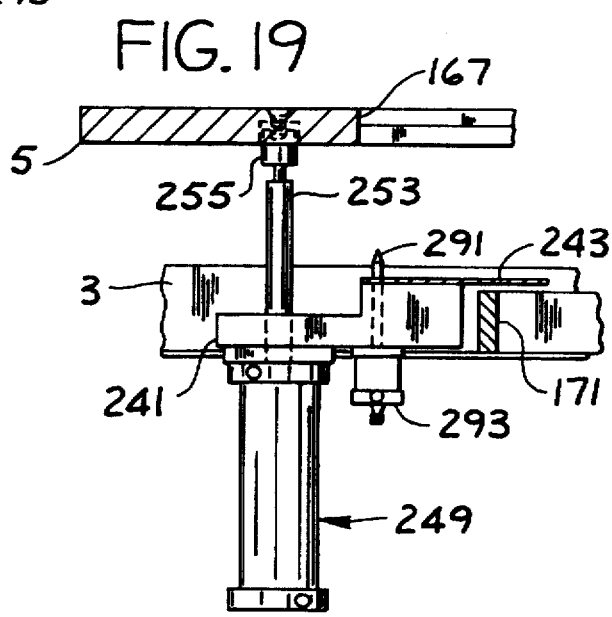

APPARATUS FOR AND METHOD OF EXPOSING PHOTOSENSITIZED PLATES

BACKGROUND OF THE INVENTION

The present invention relates to apparatus for and a method of automatically exposing photosensitive plates, and especially lithographic plates, to light through films.

This invention involves an improvement on the photographic printing apparatus shown in co-assigned U.S. Pat. Nos. 4,423,955 and 5,369,468. In that apparatus, a table at a loading station at the infeed end of the machine holds two stacks of photosensitized lithographic plates, and a sliding holder or tray holds two stacks of films above the plate stacks. A carriage is provided for conveying two plates and two films at a time from their respective stacks at the loading station to an exposure station in the machine where the plates are exposed to intense light through the films.

While the apparatus described above has been commercially successful, only a relatively small number of plates can be stacked on the table at the infeed end of the machine. As a result, an operator is required to replenish the supply of plates at relatively frequent intervals. This is labor intensive and thus costly.

SUMMARY OF THE INVENTION

Among the several objects of this invention may be noted the provision of improved photographic printing apparatus of the type shown in the aforesaid U.S. Pat. Nos. 4,423,955 and 5,369,468; the provision of such apparatus which includes a system for holding a large stack of plates (e.g., 1500 plates) and for transferring the plates from the stack to the loading station at the infeed end of the apparatus; the provision of such apparatus in which the plates are transferred to the loading station in precise position for conveyance to the exposure station; the provision of such apparatus in which a large stack of plates is quickly and easily loadable into position for use by the apparatus; the provision of such apparatus which allows for feeding of plates into the apparatus both from the side of the machine and from the infeed end of the machine; the provision of such apparatus which is safe and easy to operate; and the provision of a method for automatically delivering a plate from a large stack of plates to the aforementioned loading station and then conveying the plate to the exposure station; and the provision of such a method which is safe and reliable.

Briefly, apparatus of this invention is operable to expose photosensitized plates to light through films. The apparatus is of the type having an infeed end, an outfeed end forward of the infeed end, opposite sides, an exposure station forward of the infeed end at which a plate is exposed to light through a film, and a carriage for carrying plates and films in a forward direction from a loading station at the infeed end of the machine to the exposure station. The improvement comprises a support for supporting a stack of plates at one side of the apparatus generally adjacent the infeed end of the apparatus, and a conveyor system for conveying a plate in side-to-side direction with respect to the apparatus from the one side of the apparatus to the loading station. The apparatus also includes a transfer mechanism for removing a top plate from the stack of plates and transferring it to the conveyor system for conveyance to the loading station.

In another aspect of this invention, the apparatus comprises a support for supporting a stack of plates, a system for removing a top plate from said stack of plates and transferring it to a lift station, a system for lifting the plate at the lift station to a loading station, and a system for conveying the plate at the loading station to an exposure station. The apparatus also includes means for exposing the plate to light through a film at the exposure station.

Generally, the method of this invention comprises the steps of (a) placing a stack of plates on a support, (b) removing a top plate from the stack of plates and transferring it to a lift station, (c) lifting the plate at the lift station to a loading station, (d) conveying the plate at the loading station to an exposure station, and (e) exposing the plate to light through a film at the exposure station.

Other objects and features will be in part apparent and in part pointed out hereinafter.

BRIEF DESCRIPTION OF THE DRAWINGS

FIG. 8 is an enlarged portion of FIG. 3 showing a carriage of the plate transfer mechanism;

FIG. 9 is an enlarged vertical section taken on section lines 9—9 of FIG. 8;

FIG. 10 is a vertical section on section lines 10—10 of FIG. 8;

FIG. 12 is a side elevation of the roller conveyor of FIG. 11;

FIG. 13 is an enlarged vertical section taken on section lines 13—13 of FIG. 11;

FIG. 17 is a vertical section taken on section lines 16—16 of FIG. 11 showing the lift mechanism in its lowered position;

FIG. 18 is a vertical section taken on section lines 18—18 of FIG. 17;

FIG. 19 is a vertical section taken on section lines 19—19 of FIG. 17;

Corresponding parts are designated by corresponding reference numerals throughout the several views the drawing.

DESCRIPTION OF PREFERRED EMBODIMENT

Figure 1:
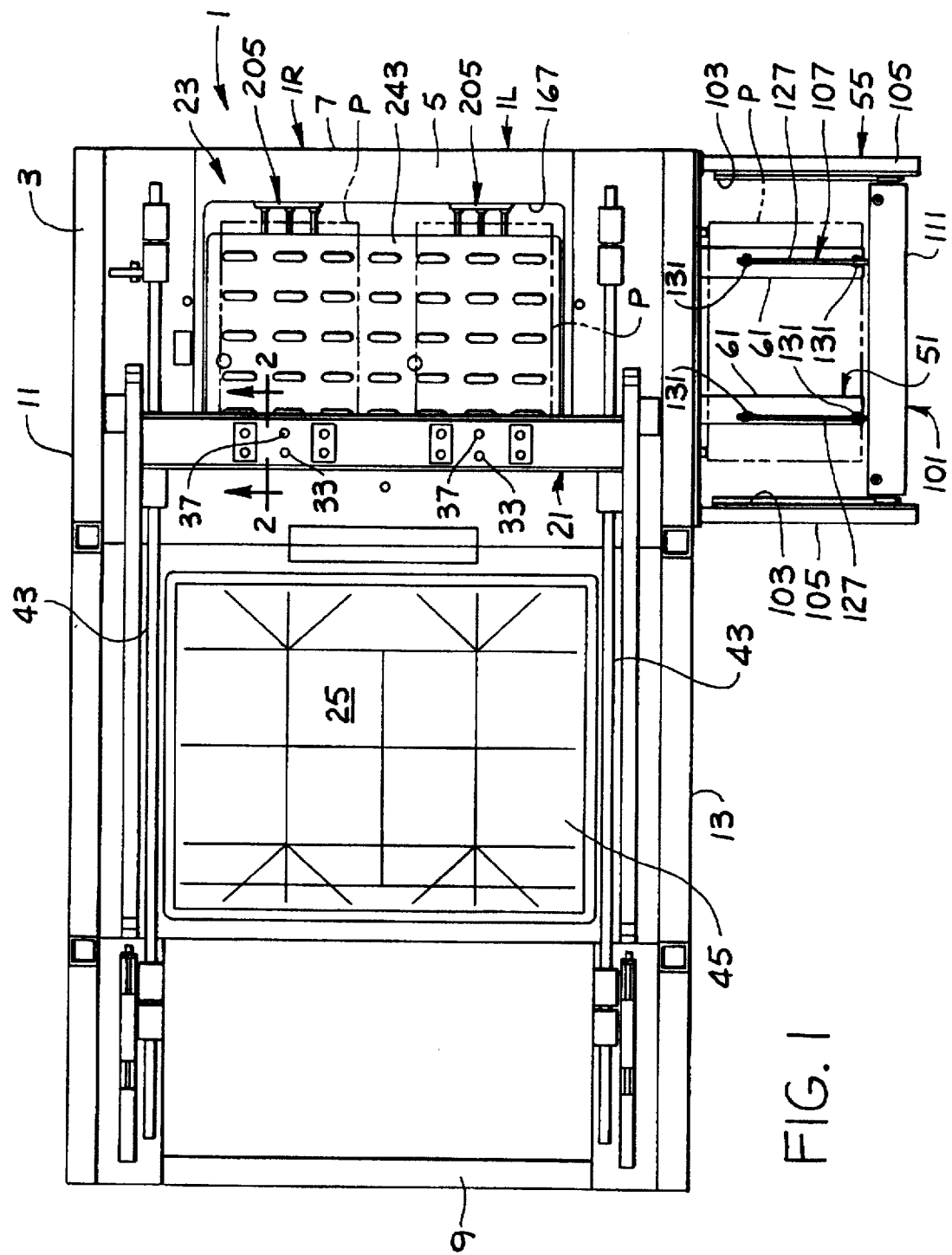
FIG. 1 is a top plan view of the apparatus of the present invention, various parts of the apparatus, such as the safety covers, being removed to show details.

Referring now to the drawings, and first to FIG. 1, apparatus of the present invention is designated in its entirety by the reference numeral 1. This apparatus is similar in many respects to the apparatus described in co-assigned U.S. Pat. Nos. 4,423,955 and 5,369,468, which are incorporated herein by reference. Apparatus 1 is designed for the automated exposure of photosensitized plates (e.g., lithographic plates having a light-sensitive coating on one surface thereof such as are widely used in the newspaper printing) to light through films (e.g., photographic negatives of newspaper pages to be printed). It will understood, however, that the present invention may be embodied in apparatus for exposing other photosensitized plates, and in apparatus in which film positives may used instead of negatives.

As viewed in FIG. 1 (which is a top plan view), the apparatus comprises a main frame 3, and a generally rectangular table 5 supported by the frame. The apparatus has an infeed (right) end 7, an outfeed (left) end 9, and opposites sides 11, 13, movement of plates through the machine being from right to left in what may be referred to as a "forward" direction. In general, apparatus 1 comprises an infeed carriage, generally designated 21, for carrying plates (individually designated P) and films (individually designated F) from a loading station 23 at the infeed end of the machine to an exposure station 25 forward of the infeed end at which a plate is exposed to light through a film, as described in detail in the aforementioned patents. The apparatus has two side-by-side exposure lines 1L, 1R for simultaneously exposing two single-page plates P to light through two single-page films F, "single-page" referring to single newspaper pages. The apparatus is also operable to expose one double-page plate P at a time to light through a double-page film. Hereinafter, the operation of the machine will be described in the context of delivering two single-page plates and two single-page films at a time to the exposure station. Of course, it is contemplated that the present invention can be used in connection with apparatus having only one exposure line for handling only one single-page plate and film at a time.

Figure 2:
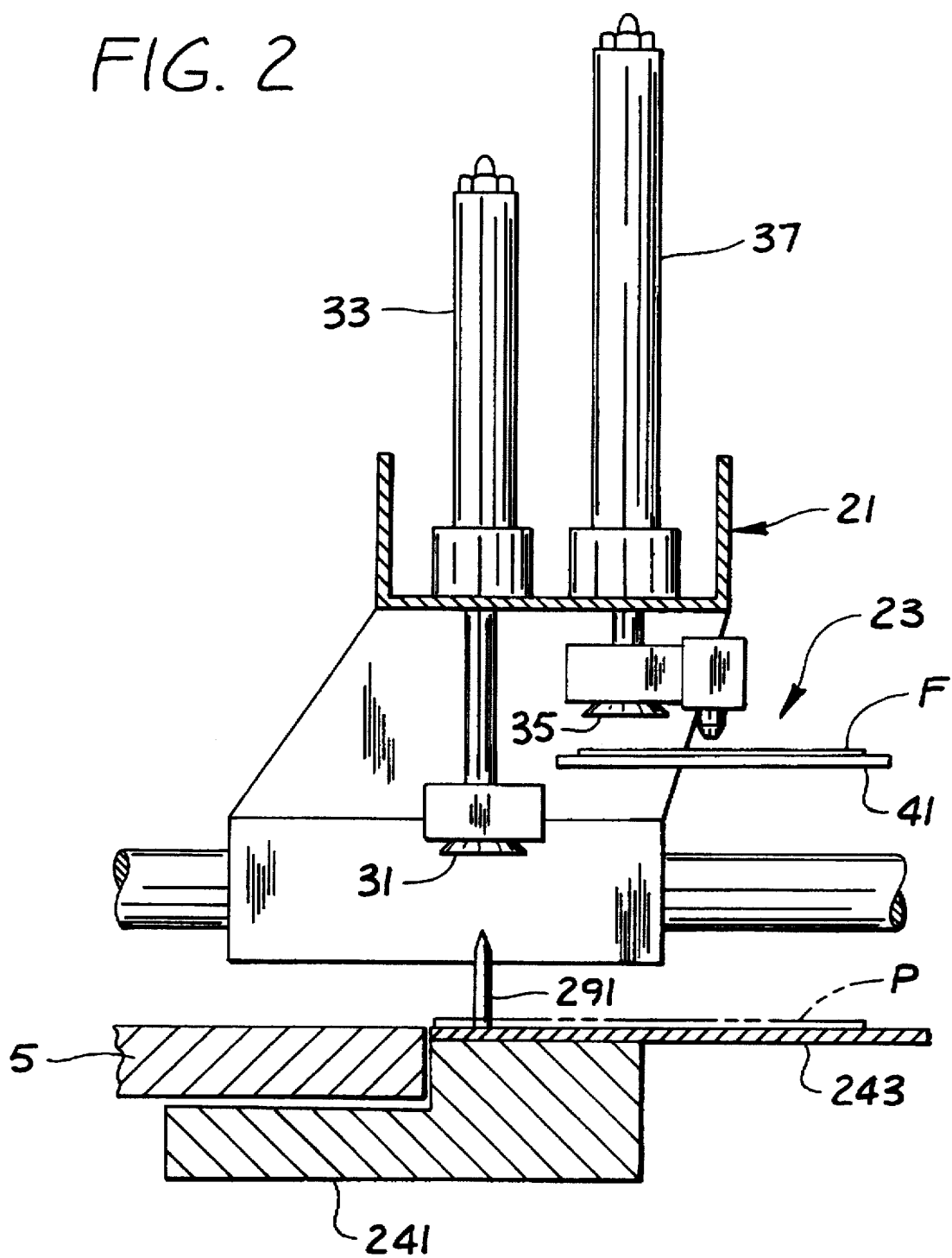
FIG. 2 is an enlarged vertical section along section lines 2—2 of FIG. 1.

As shown in FIGS. 1 and 2, the infeed carriage 21 has a first series of vacuum grippers 31 movable by cylinders 33 for picking up two side-by-side single-page plates P at the loading station 23, and a second series of vacuum grippers 35 movable by cylinders 37 for picking up two side-by-side films F from two stacks of films F held in a tray 41 above and offset rearward from the table 5. The carriage 21 is movable by suitable means along rails 43 at opposite sides of the apparatus to carry plates and films in a forward direction from the loading station 23 to the exposure station 25, to deposit the plates and films on a platen 45, and then to return for pick up of two more plates and films at the loading station. Reference may be made to the aforementioned patents for details concerning the construction and operation of the carriage 3 and its associated vacuum grippers 31, 35.

In accordance with the present invention, apparatus 1 also includes an automated side-loading system comprising a support, generally indicated at 51, for supporting a stack of plates P outboard of the main frames 3 (see FIG. 1) at one side of the apparatus generally adjacent the infeed end 7 of the apparatus, and a conveyor system, generally designated 53, for conveying a plate in side-to-side direction with respect to the apparatus from the one side of the apparatus to the loading station 23. The apparatus further comprises a transfer mechanism, generally designated 55, for removing a top plate from the stack of plates held by the support 51 and transferring it to the conveyor system 53 for conveyance to the loading station 23 for pick-up by the carriage 3.

Specifically, as shown in FIGS. 4–7, the support 51 comprises a pair of horizontal tines, each designated 61, projecting out from a cross beam 63, the tines being spaced apart a distance somewhat less than the length of a plate P so that they can stably support a stack of plates resting on the tines (or on a holder resting on the tines). Each tine 61 is formed by an inverted channel having a reinforcing bar 65 running substantially its entire length on the underside of the horizontal web of the channel (see FIG. 5). The channel 61 is suitably fastened at one end to the cross beam 63, as by welding and stiffening gussets 67. The tines are sufficiently strong to hold a large stack of plates (e.g., 1500 plates).

Indicated generally at 71 is an elevator mechanism for raising the support tines 61 as plates are removed from the stack of plates on the tines, thus maintaining the top of the stack at a relatively constant elevation. This elevator mechanism 71 comprises a screw shaft 73 (FIG. 7) having upper and lower ends journalled in bearings 75 mounted on the main frame 3 for rotation by a reversible motor 77, also mounted on the main frame. The screw shaft is cooperable with a nut 79 held by a bracket 81 secured to the cross beam 63, the arrangement being such that rotation of the screw shaft in one direction causes the cross beam and the tines to move up, and rotation of the screw shaft in the opposite direction causes the cross beam and the tines to move down. A pair of sliders 85 are mounted on the cross beam 63 adjacent its ends (see FIG. 5). These sliders are slidable along a pair of vertical guide rods 87 to maintain the cross beam 63 horizontal as it moves up and down. The guide rods 87 are attached at their upper and lower ends to the frame 3 of the machine. Operation of the motor 77 is controlled by a photosensor (not shown) mounted at a predetermined elevation on the frame 3. The photosensor and associated circuitry function to operate the motor to maintain the top of a stack of plates on the tines 61 at a predetermined elevation. Therefore, as plates are removed from the stack, the motor will rotate the screw shaft 73 in one direction to raise the stack. A manual switch is provided to reverse the motor to rotate the screw shaft in the opposite direction to lower the tines to permit additional plates to be loaded on the tines.

Figure 3:
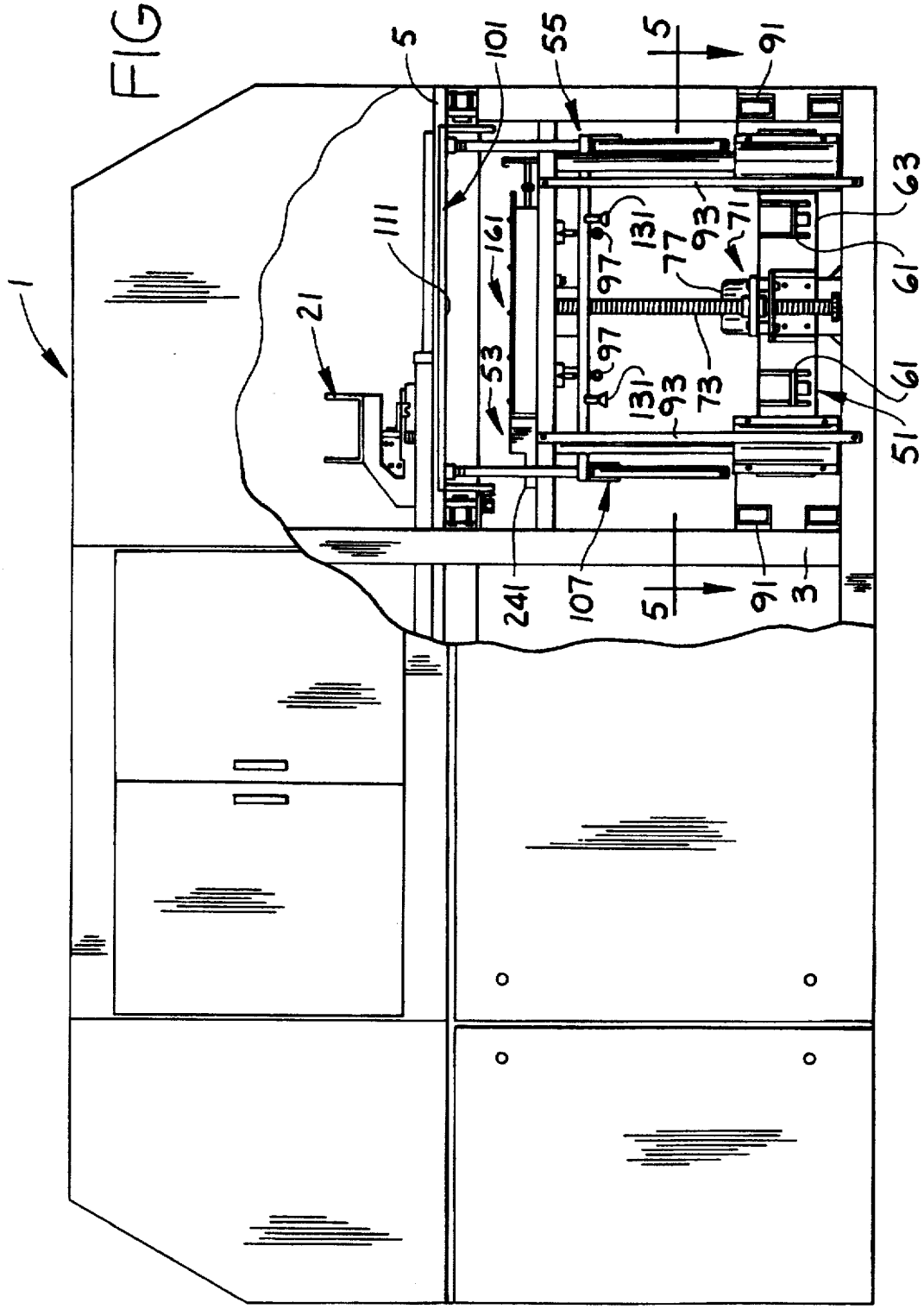
FIG. 3 is a side elevation of the apparatus of FIG. 1 showing the safety covers installed on the machine, part of the covers being broken away to show a plate transfer mechanism of this invention.
Figure 5:
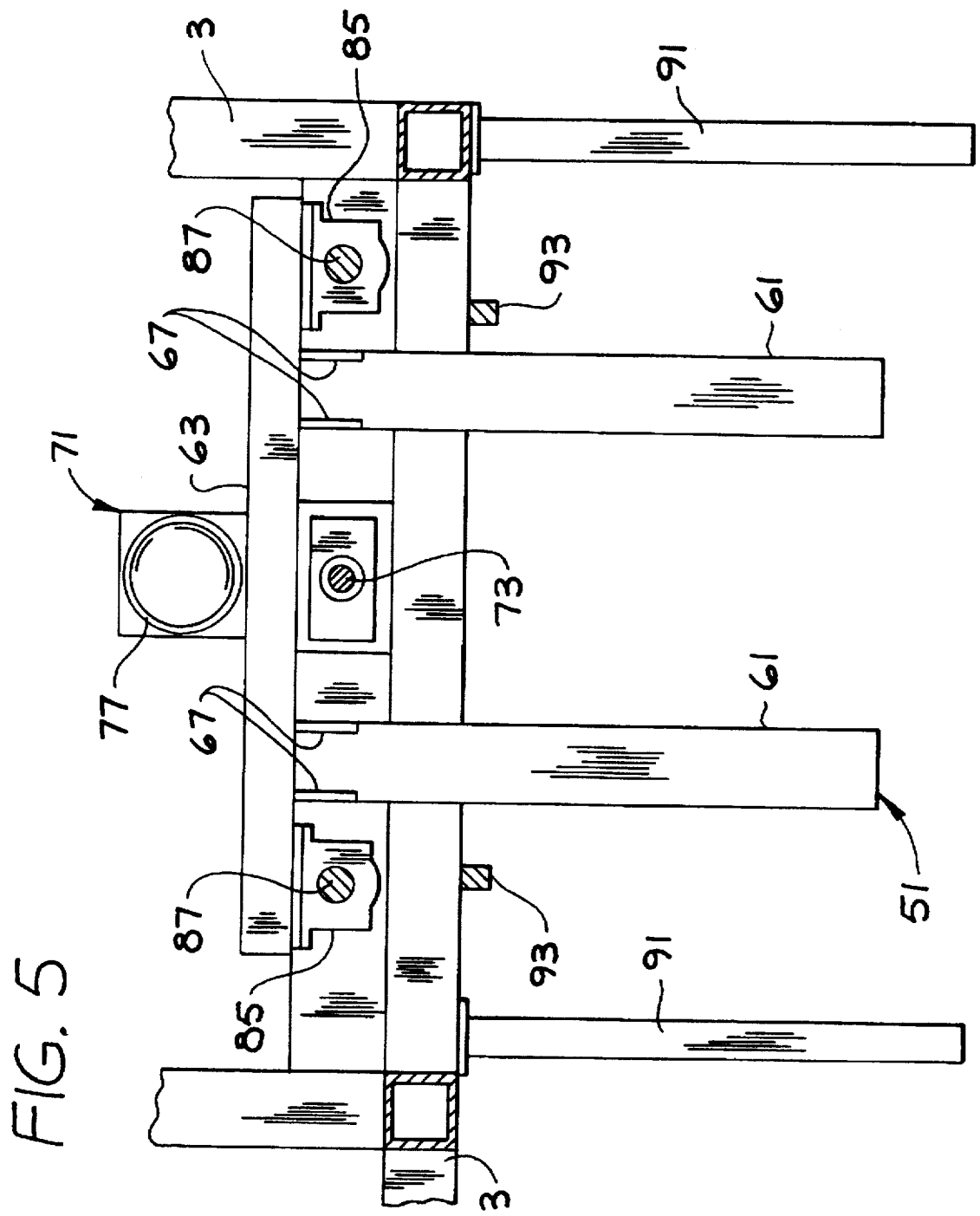
FIG. 5 is an enlarged horizontal section on section lines 5—5 of FIG. 3.
Figure 6:
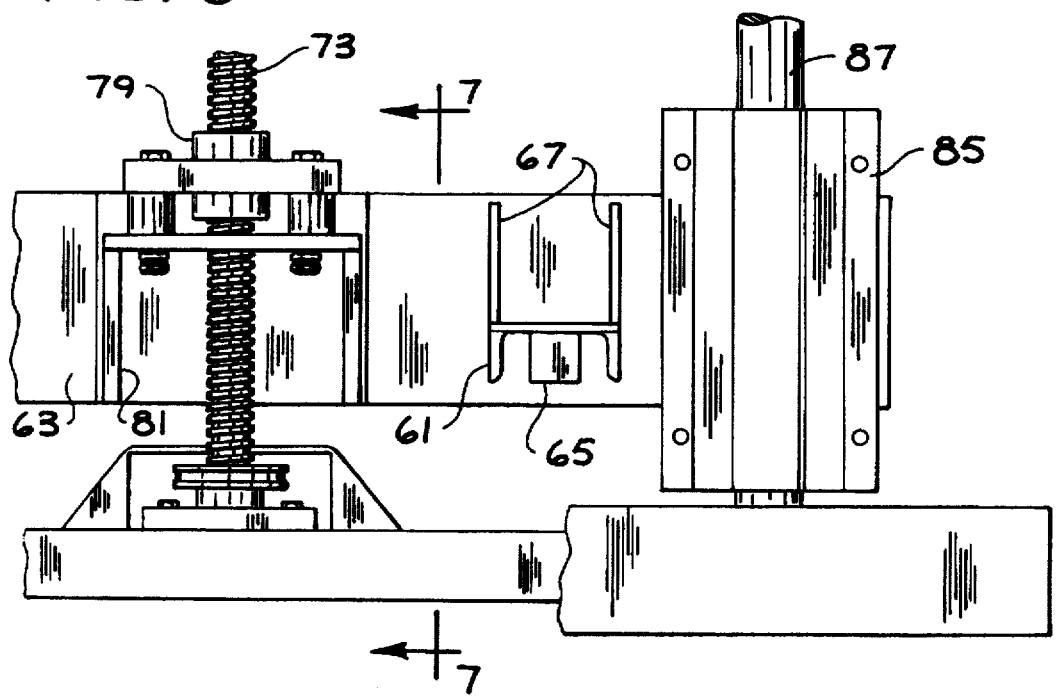
FIG. 6 is an enlarged portion of FIG. 3 showing an elevator mechanism.

To ensure proper positioning of a stack of plates on the tines, horizontal positioning bars 91 project out from the main frame 3 on opposite sides of the tines 61 at an elevation somewhat above the tines (see FIGS. 3 and 5). The spacing between these bars is somewhat greater than the width of the stack. Also, a pair of vertical positioning bars 93 are affixed to the main frame as shown in FIG. 5. The positioning bars are placed so that a stack of plates placed on the tines between the horizontal positioning bars and against the vertical positioning bars is stably supported on the tines in proper position for handling by the transfer mechanism 55.

Figure 7:
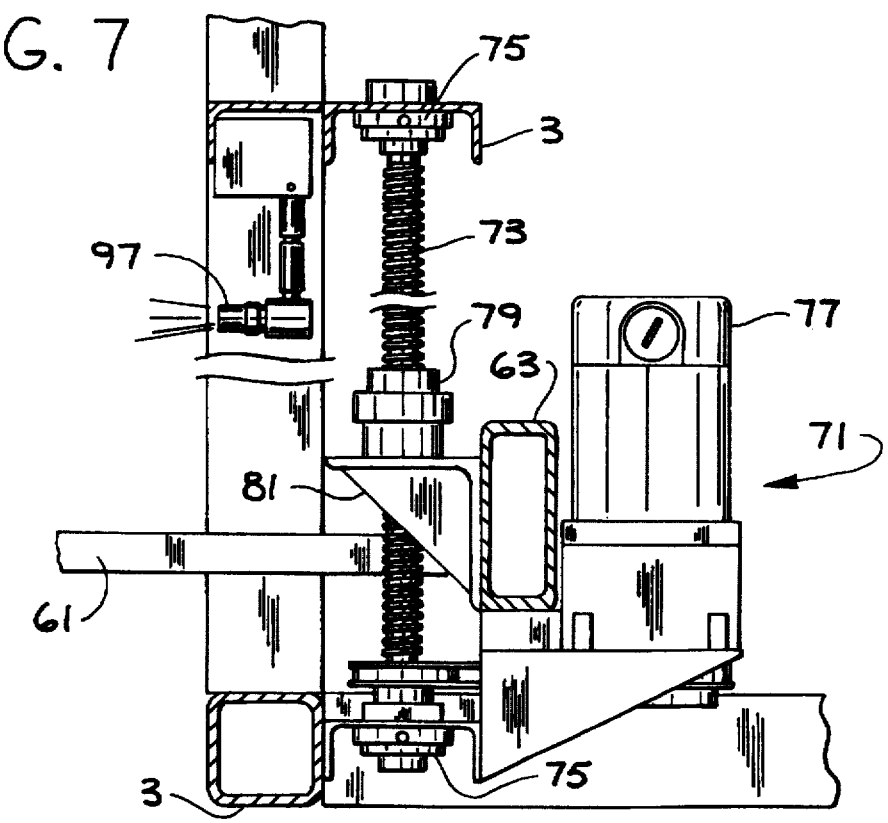
FIG. 7 is a section generally taken on section lines 7—7 of FIG. 6.

As shown best in FIGS. 3 and 7, a pair of blowers comprising air nozzles 97 are secured to the main frame 3 at a height generally corresponding to the top of a stack of plates P on the tines 61. These blowers 97 are positioned to direct streams of pressurized air toward and under the top plate of the stack to facilitate separation of the plate from the stack for pick-up by the transfer mechanism 55, described below.

The transfer mechanism 55 for removing a top plate from the stack of plates comprises a transfer carriage generally indicated at 101 movable on horizontal tracks 103 mounted on a pair of beams 105 projecting out from the main frame 3 above the top of the stack. The mechanism also includes a gripper mechanism, generally designated 107, on the carriage 101 movable up and down relative to the stack for gripping the top plate of the stack, the carriage being operable to carry a plate gripped by the gripper mechanism to the aforementioned conveyor system 53.

More specifically, as shown in FIG. 8, the carriage 101 comprises a horizontal cross bar 111 extending in end-to-end direction with respect to the apparatus, a pair of end bars 113 depending vertically from the cross bar at its opposite ends, and a pair of C-shaped runners 115 mounted on the outboard sides of the end bars engageable with the aforementioned tracks 103 which are constituted by elongate bars of suitable material fastened to the horizontal beams 105 extending in cantilever fashion out from the main frame 3. Movement of the carriage along the tracks is effected by a suitable power actuator which is illustrated in FIGS. 8 and 10 as a rodless pneumatic cylinder 119 fastened to one of the beams 105 and having its piston connected to an adjacent end bar 113 of the carriage 101. The connection is preferably by means of a pivot connector 121 to allow a small amount of lost motion between the carriage and the piston of the actuator 119 to avoid undue stress and strain during starts and stops. The range of travel of the carriage along the track is established by Reed switches on the cylinder 119. The cylinder 119 may be of the type commercially available from Origa Corporation, located in Elmhurst, Ill., under the trademark "Origa".

Figure 4:
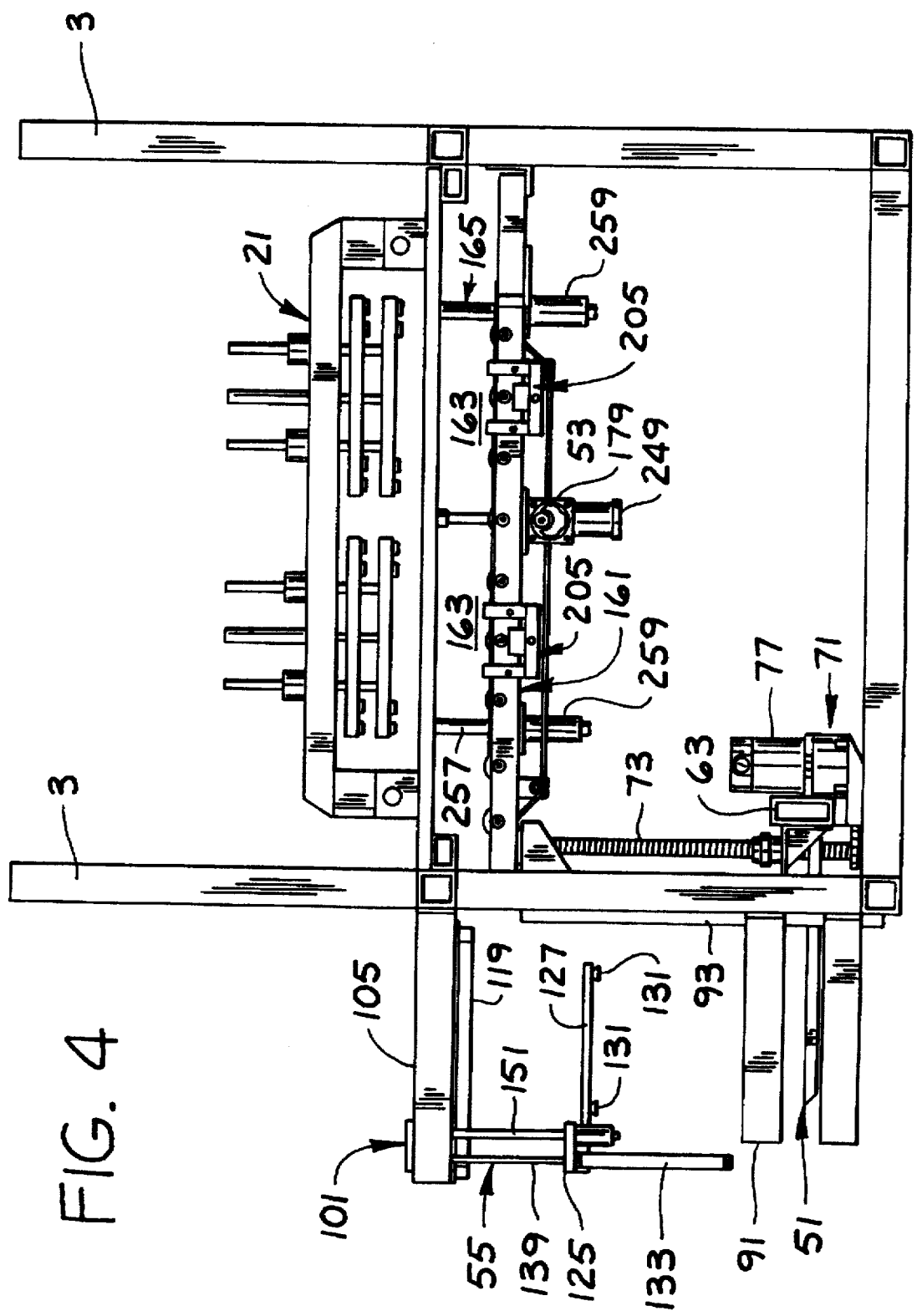
FIG. 4 is a right (infeed) end elevation of the machine of FIG. 1.

The gripper mechanism 107 on the carriage 101 comprises a horizontal cross beam 125 spaced below and carried by the cross bar 111 of the carriage 101, and a pair of parallel gripper arms 127 attached at one of their ends to the cross beam 125 and extending out over the stack of plates (FIGS. 1 and 4). Each gripper arm 127 carries a pair of suction cups 131, for a total of four suction cups which are arranged so that they are engageable with the top plate of the stack of plates generally adjacent the four corners of the plate. The suction cups are connected to suitable vacuum lines (not shown). The cross beam 125 and gripper arms 127 are movable up and down relative to the cross bar 111 of the carriage by a pair of power actuators 133, such as pneumatic cylinders, adjacent opposite ends of the cross beam. As shown in FIGS. 8 and 9, each cylinder 133 has a cylinder body 135 having a threaded upper end 137 screwed into the cross beam, and a rod 139 which extends up through the cross beam for connection to a rod coupler 141 fastened to a mounting block 143 attached to the underside of the cross bar 111 of the carriage. The operation of the cylinders 133 is such that when air is introduced into the upper ends of the cylinders, the cylinder bodies 135 are forced down to lower the gripper arms 127 carrying the suction cups 131, and when air is introduced into the lower ends of the cylinders, the cylinder bodies are forced up to raise the gripper arms and any plate P carried by the suction cups. Other means could be used to effect the vertical travel of the gripper mechanism 107. The range of such travel is controlled by proximity switches or the like.

A pair of vertical guide shafts, each designated 151, are attached at their upper ends to the cross bar 111 of the carriage adjacent its ends. These shafts extend down through bushings 153 fastened to the cross beam 125 of the gripper mechanism adjacent the ends of the beam, as depicted in FIG. 9. The bushings slide up and down on the guide shafts 151 to stabilize the gripper mechanism as it moves between its raised and lowered positions.

Referring now to FIGS. 4 and 11–13, the aforementioned conveyor system 53 comprises a conveyor 161 for receiving plates P from the transfer mechanism 55 described above and for conveying them in side-to-side direction with respect to the apparatus to lift stations 163 underneath the table directly below the aforesaid loading station 23. The conveyor system also includes a lift mechanism 165 for raising plates at their respective lift stations up through an opening 167 (FIG. 1) in the table 5 to the loading station 23 for pickup by the infeed carriage and delivery of the plates to the exposure station 25.

The conveyor 161 illustrated in the drawings (e.g., FIGS. 11–13) is a horizontal roller conveyor having a frame comprising a pair of parallel side rails 171 which extend in side-to-side direction with respect to the machine and which are secured at their opposite ends to the main frame 3 of the machine at an elevation below the table 5. A plurality of shafts 173 carrying rollers 175 extend between the side rails. The ends of these shafts 173 are journalled in bearings in the side rails, and the shafts are interconnected for conjoint rotation by a drive chain 177 in engagement with sprockets on the shafts. The shafts are rotated by a motor 179 (mounted on the conveyor frame) having a drive shaft which is coupled to a drive gear 181 on one of the roller shafts 173, the arrangement being such that rotation of this one shaft 173 by the motor effects rotation of all shafts on the conveyor via the aforementioned chain and sprockets. The conveyor frame has a length sufficient to hold two side-by-side single-page plates at their respective lift stations 163 directly below the opening 167 in the table. Other types of conveyors may be used without departing from the scope of this invention.

Plates P conveyed along the conveyor 161 are stopped by first stop means comprising two pairs of stops, the two stops of the first pair (each designated 185) being located adjacent the downstream end of the conveyor and the two stops of the second pair (each designated 187) being located upstream of the first pair (FIG. 13). The first pair of stops 185 comprises two fixed stop pins extending up from a support member 191 on the conveyor frame to a level above the tops of the rollers 175 for engagement by a plate P fed forward on the roller conveyor to stop a single-page plate directly below exposure line 1R. A photosensor 193 is provided for sensing the leading edge of this plate when it has engaged the stop pins 185. The second pair of stops 187 comprises two stop pins mounted on a similar support member 195 on the conveyor frame. These stop pins 187 are movable by means of pneumatic cylinders 199 (FIG. 13) or the like between lowered positions in which they are below the tops of the rollers 175 so they will not interfere with travel of a plate P along the conveyor, and raised positions in which they extend above the rollers for stopping a single-page plate directly below exposure line 1L. A photosensor 201 (FIG. 13) is provided for sensing the leading edge of this plate when it has engaged the stop pins 187. It will be understood, therefore, that the two pairs of stop pins 185, 187 function to stop plates P fed along the conveyor in precise positions longitudinally with respect to the conveyor (i.e., with respect to the direction of conveyor feed).

Figure 11:
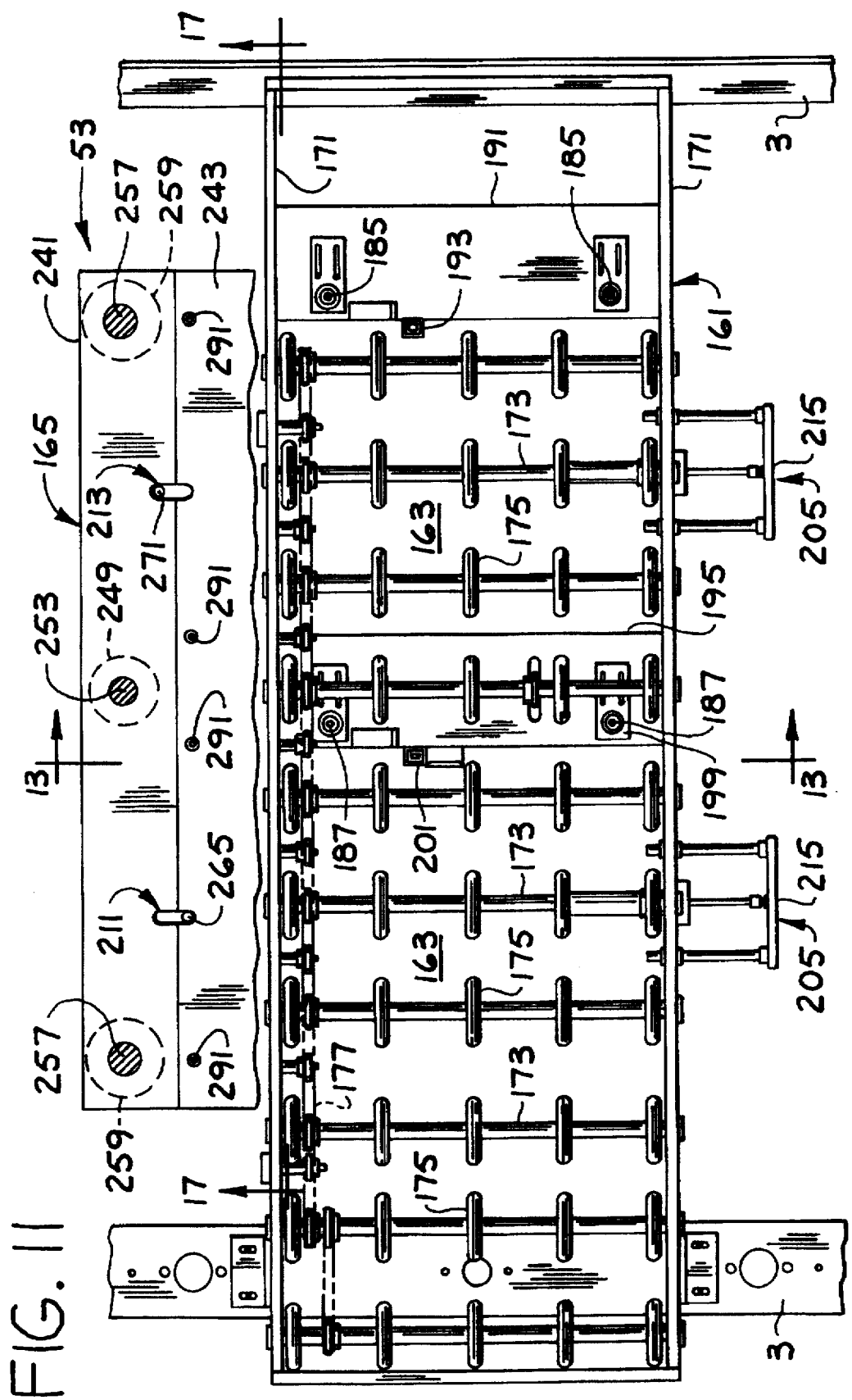
FIG. 11 is a top plan of a roller conveyor of the plate transfer mechanism, and of part of a plate lift mechanism.

A pair of pusher assemblies, each generally designated 205, are mounted at one side of the conveyor frame for pushing plates P on the roller conveyor 161 against second stop means comprising a pair of lateral stop assemblies located adjacent the opposite side of the conveyor frame, the upstream lateral stop assembly being generally indicated at 211 and the downstream lateral stop assembly generally at 213 (FIG. 11). The pusher assemblies and stop assemblies cooperate to precisely position the plates in a transverse direction with respect to the conveyor. Thus, the stop pins 185, 187, pusher assemblies 205, and lateral stop assemblies 211, 213 function as means for moving plates P on the roller conveyor 161 to precise positions at their respective lift stations 163.

Figure 14:
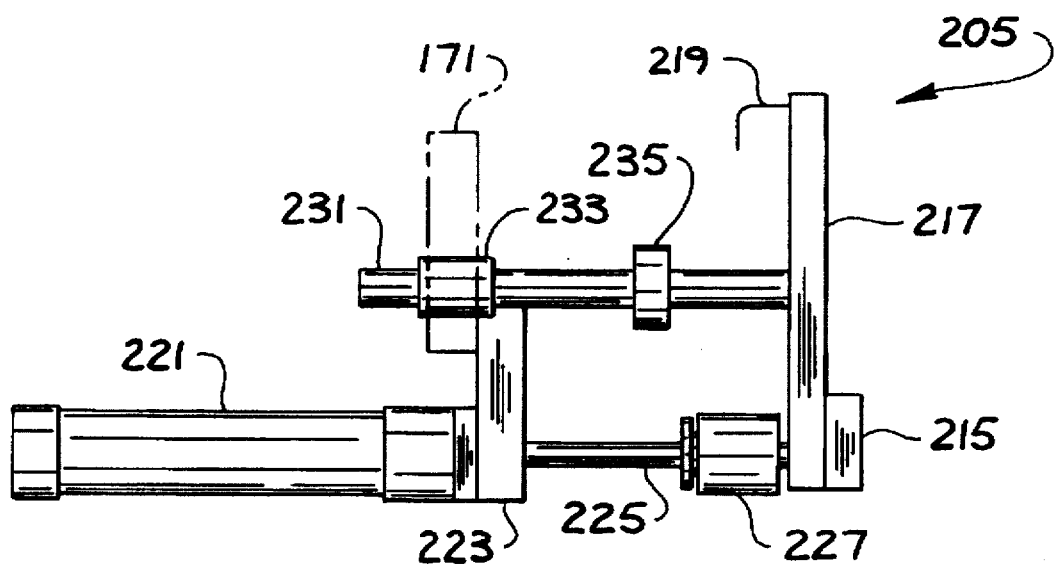
FIG. 14 is an elevation of a pusher assembly.
Figure 15:
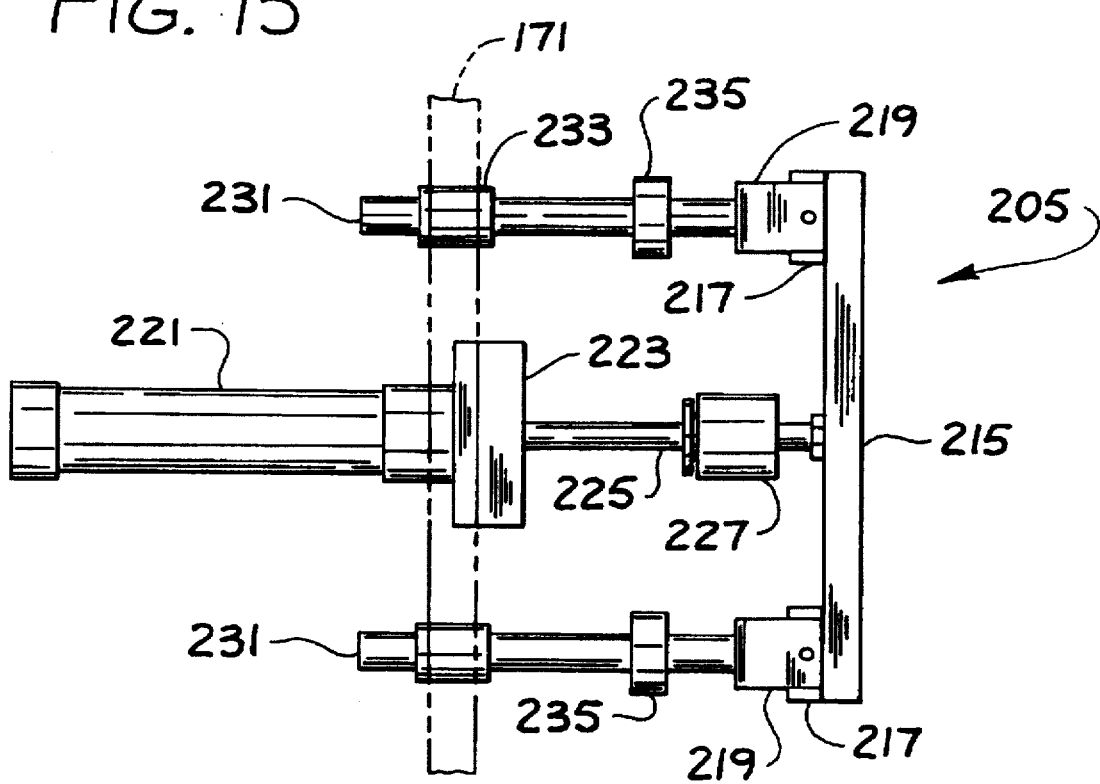
FIG. 15 is a top plan view of the pusher assembly of FIG. 14.

As illustrated best in FIGS. 14 and 15, each pusher assembly 205 comprises a generally U-shaped pusher frame formed by a horizontal bottom bar 215 extending generally parallel to the conveyor frame, and two vertical side bars 217 extending up from the bottom bar adjacent its ends. A spring pusher element 219 is mounted at the upper end of each side bar (FIG. 14), and the spring element has a bent end positioned at an elevation suitable for engaging the edge of a plate P on the conveyor 161. The pusher frame is movable toward and away from the conveyor by means of an actuator which is illustrated as being a pneumatic cylinder 221 mounted on a block 223 fastened to a side rail 171 of the conveyor frame. The cylinder has a rod end 225 which is connected via a rod coupler 227 to the bottom bar 215 of the pusher frame to effect movement of the pusher frame. A pair of parallel guide shafts, each designated 231, extend from the vertical side bars 217 through bushings 233 in the conveyor frame to guide the pusher frame as it moves toward and away from the conveyor frame. Collars 235 on the guide shafts 231 are engageable with the ends of the bushings 233 to limit the travel of the pusher frame toward the conveyor frame. The collars 235 are adjustable along the guide shafts. The spring elements 219 are of suitably flexible but resilient material (e.g., spring steel) selected to provide a firm push to a plate P while yielding slightly when the plate engages a respective lateral stop 211, 213 at the opposite side of the conveyor to avoid damaging the plate.

Figure 16:
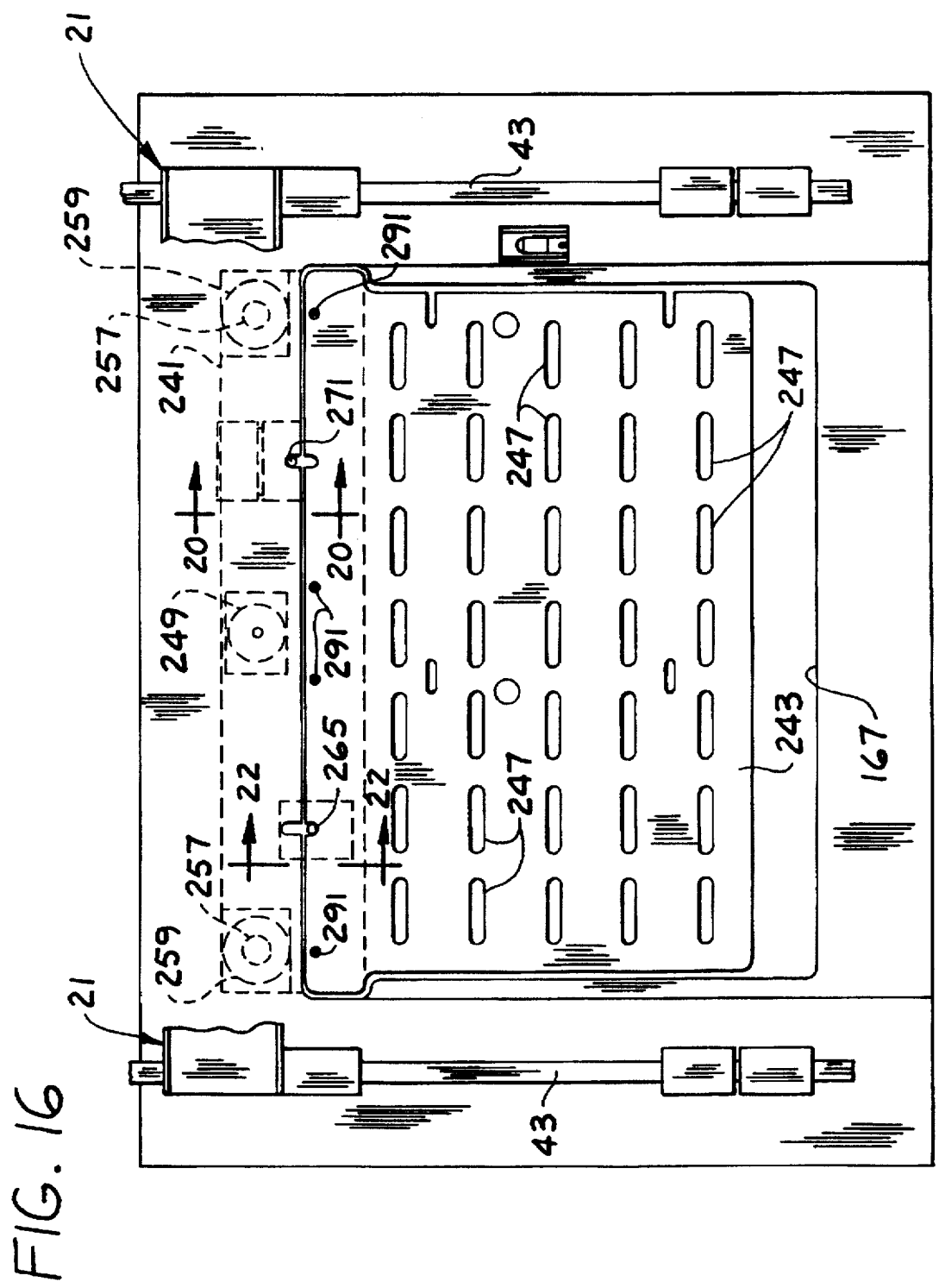
FIG. 16 is an enlarged part of FIG. 1 showing the lift mechanism receivable in an opening in the table of the apparatus.

The lift mechanism 53 of the conveyor system comprises a beam 241 extending along the roller conveyor frame at the side of the frame opposite the pusher assemblies 205. A lift member in the form of a perforated plate 243 is fastened to the top surface of the beam 241 and extends in cantilever fashion in a horizontal plane from the beam out over the roller conveyor 161. The lift plate 243 has a plurality of openings 247 (FIG. 16) therein for receiving the tops of the rollers 175 of the conveyor. The beam 241 and lift plate 243 are movable vertically by means of a power actuator 249 between a lowered position in which the lift plate is disposed at an elevation somewhat below the tops of the rollers and in which the tops of the rollers project up through the openings 247 in the lift member for engagement with plates P, and an elevated position for supporting plates P at the loading station 23 at an elevation generally corresponding to the top surface of the table 5. It will be observed in this regard that the opening 167 in the table is sized and shaped for receiving the lift plate 243 therein. The power actuator 249 is illustrated in FIGS. 17 and 19 as being a cylinder having a cylinder body 251 attached to the beam 241 generally midway between the ends of the beam, and a rod 253 which extends up through a hole in the beam for attachment to the table 5 via a rod coupler 255. Movement of the beam 241 is guided by a pair of vertical guide rods 257 extending down from the table 5 through bushings 259 affixed to the underside of the beam adjacent the ends of the beam (FIG. 18).

Figure 22:
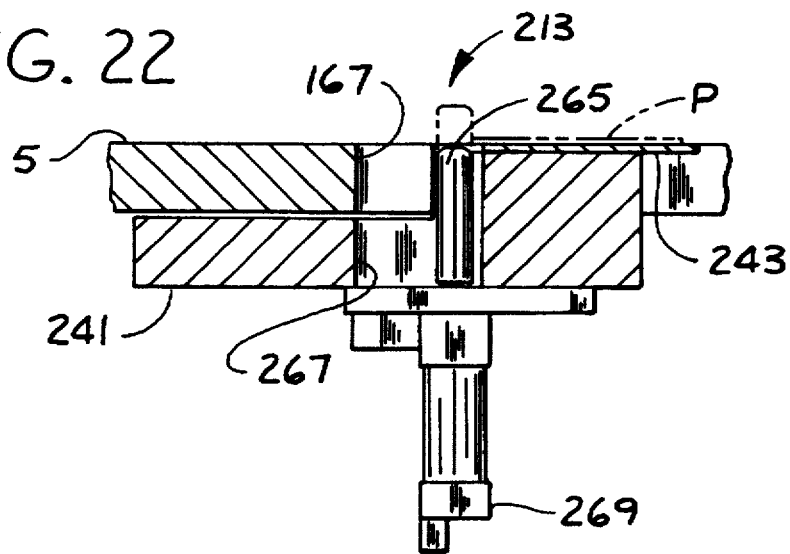
FIG. 22 is an enlarged vertical section taken on section lines 22—22 of FIG. 16 showing an upstream lateral stop assembly.

Referring to FIG. 22, the upstream lateral stop assembly 213 is shown as comprising a vertical stop member 265 extending up through an opening 267 in the beam 241 of the lift mechanism, and an actuator 269 (e.g., a pneumatic cylinder) mounted on the underside of the beam for moving the stop member 265 between a lowered position (shown in solid lines in FIG. 22) in which its upper end is below the horizontal plane of the lift plate 243, and a raised position (shown in phantom lines) in which it extends up above the lift plate to a level in which it is engageable by a plate P pushed laterally by the pusher assemblies 205 when the lift mechanism 53 is in its lowered position. The opening 267 through which the stop member extends is preferably a slot to provide for adjustment of the stop member 265 in a transverse direction with respect to the beam 241 (and with respect to the roller conveyor 161).

Figure 20:
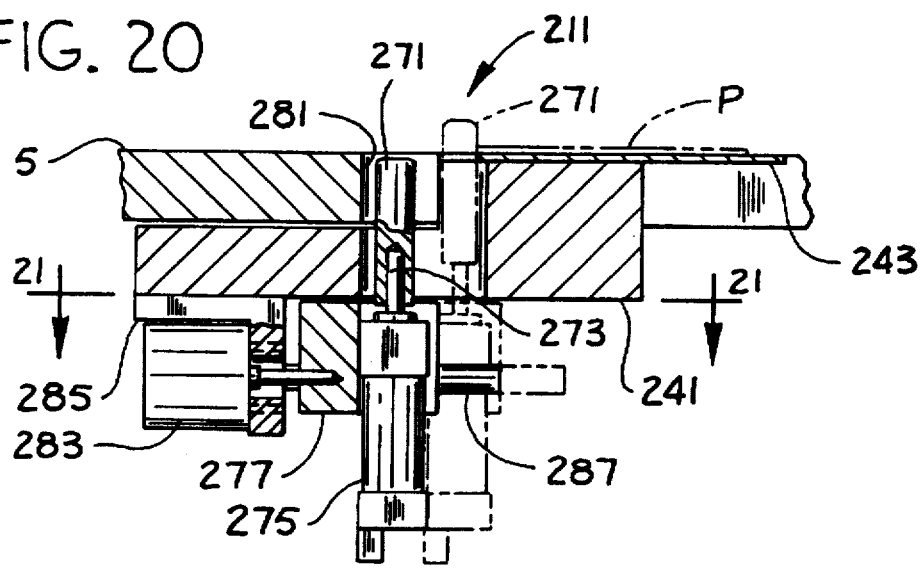
FIG. 20 is a vertical section taken on section lines 20—20 of FIG. 16 showing a downstream lateral stop assembly.
Figure 21:
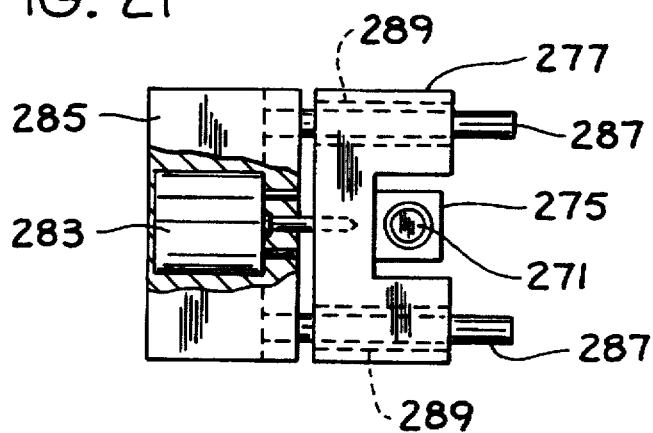
FIG. 21 is a horizontal section on section lines 21—21 of FIG. 20.

The downstream lateral stop assembly 211, shown in FIGS. 20 and 21, comprises a vertical stop member 271 mounted on the rod 273 of a cylinder 275 fastened to a C-shaped mounting block 277 on the underside of the beam 241. The stop member 271 extends up through a slot 281 in the beam 241 and is movable by the cylinder 275 between raised and lowered positions, like the upstream vertical stop member 265. The mounting block 277 carrying the cylinder 275 and stop member 271 is movable in a horizontal plane by means of a second cylinder 283 on the underside of the beam 241 between a retracted position (shown in solid lines in FIG. 20) away from the roller conveyor 161 and an extended position (shown in phantom lines) toward the roller conveyor. The reasons for this movement will be explained later. The second cylinder 283 is attached to an angle structure 285 affixed to the underside of the beam 241. A pair of parallel guide shafts 287 extend horizontally from this angle structure 285 through bushings 289 in the mounting block 277 for guiding the mounting block as it moves between its extended and retracted positions.

As shown best in FIGS. 11 and 17–19, the lift mechanism 53 further comprises a plurality of registration pins (e.g., four pins), each designated 291. These pins 291 are spaced at suitable intervals along the beam 241 for reception in prepunched registrations holes in the plates P after they have been precisely positioned at their respective lift stations 163 on the roller conveyor 161. The registration pins 291 extend up through holes in the beam 241 and are movable between raised and lowered positions by means of cylinders 293 mounted on the underside of the beam. The registration pins 291 serve to hold the plates in precise position while they are raised to the loading station 23 of the machine.

The operation of the machine and its various elements is controlled by a programmable logic controller (not shown) programmed to accomplish the steps described below.

Prior to operation of the apparatus, a stack of single-page plates P is placed on the two tines 61 below the transfer mechanism 55. It will be understood that the stack may be placed directly on the tines. Alternatively, the stack may be placed on a skid or in some other type of holder which is then placed on the tines. In either event, the stack should be located between the horizontal positioning bars 91 and butted up against the vertical positioning bars 93 to ensure proper positioning of the stack relative to the transfer mechanism. After the stack is in place, the elevator motor 77 is turned on to rotate the screw shaft 73 to raise the stack cross beam 63 and tines until the top of the stack reaches a predetermined elevation, (as sensed by a photoelectric sensor, for example), at which point the motor is deenergized.

Figure 23A:
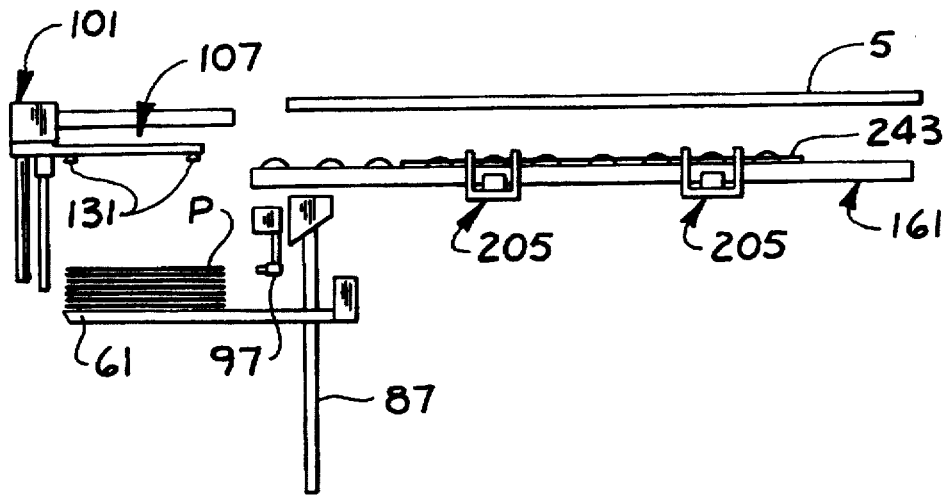
FIGS. 23A-23I are schematic views illustrating sequential steps in the operation of the transfer and lift mechanisms.

At the beginning of a cycle of operation the transfer mechanism 55 is in a home position in which the carriage 101 is at the left end of its tracks 103 as viewed in FIG. 23A, and in which the gripper mechanism 107 is in its raised position directly above the stack of plates P. The lift mechanism 53 is in its lowered position in which the lift plate 243 is below the tops of the rollers 175 of the roller conveyor 161. The roller conveyor motor 179 is on to drive the conveyor. The registration pins 291 are down; the upstream stops 187 are down; the pusher assemblies 205 are away from the roller conveyor; the lateral stop members 265, 271 are down; and the downstream lateral stop member 271 is in its retracted position.

Figure 23B:
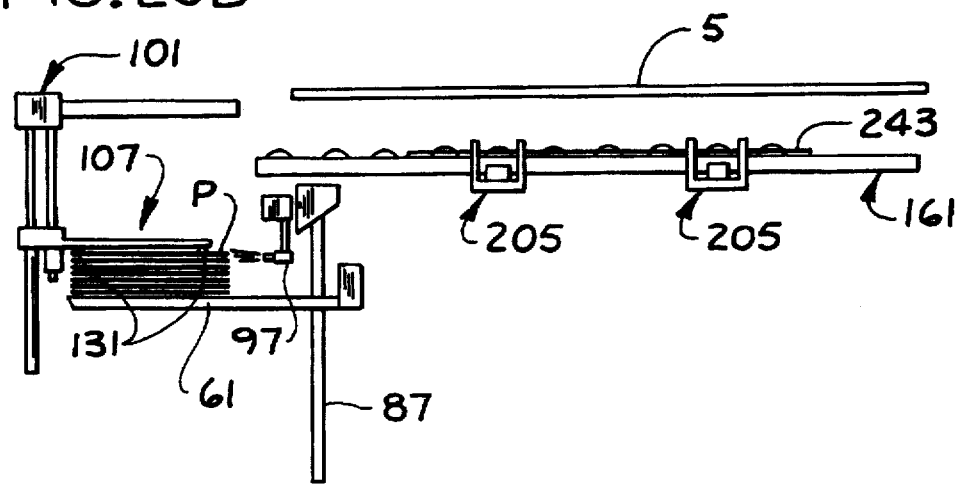
Figure 23C:
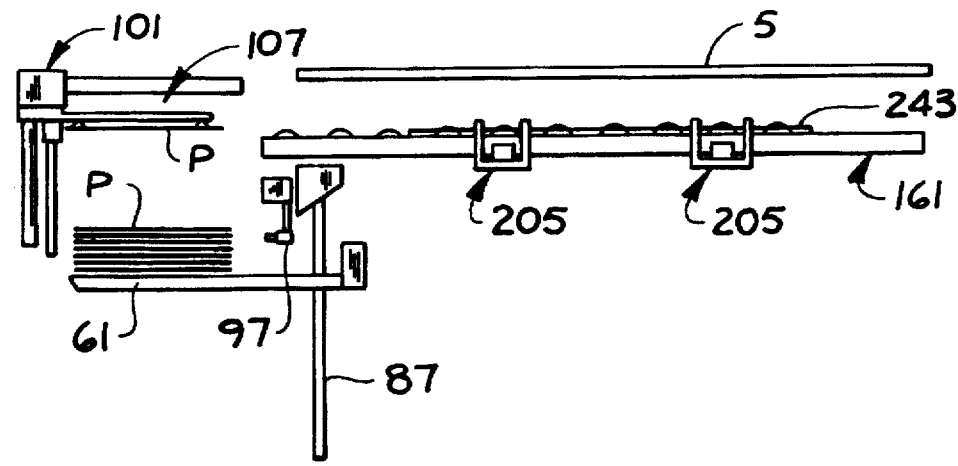
Figure 23D:
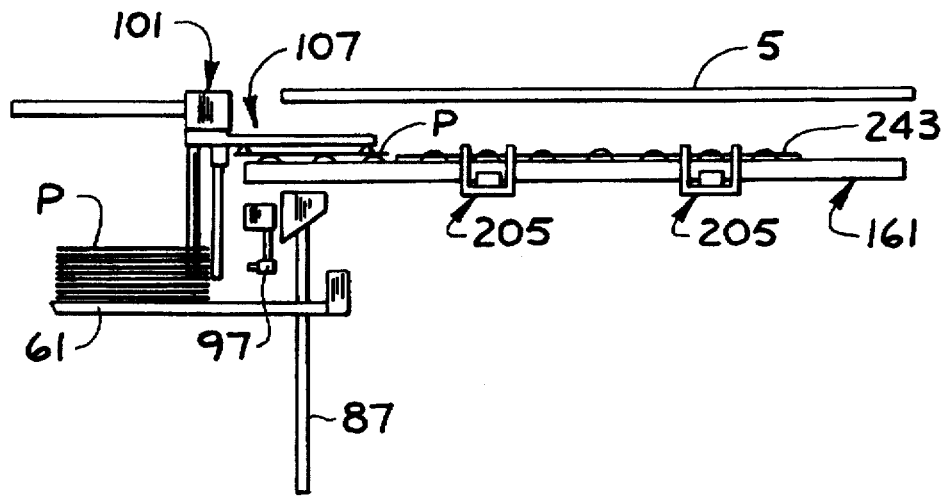
Figure 23E:
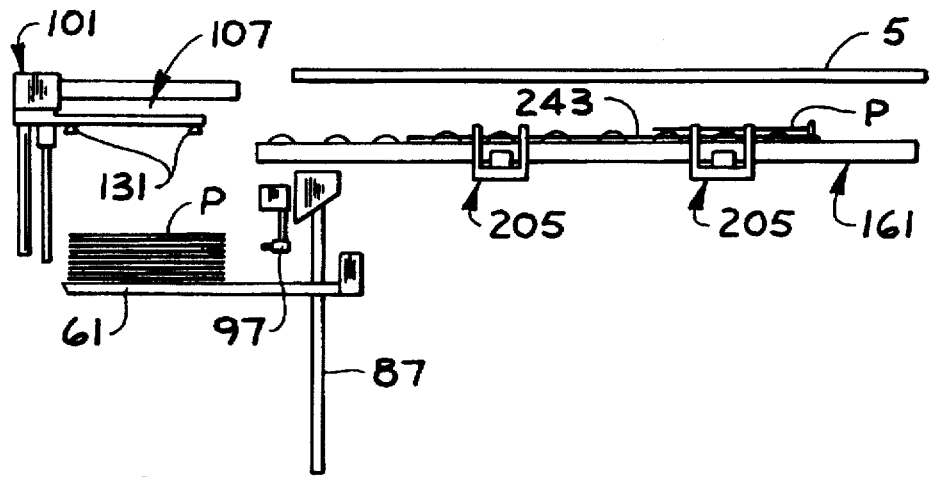

To begin a cycle of operation, appropriate signals are sent to cause a vacuum to be drawn in the suction cups 131, and to cause the gripper mechanism 55 to descend to its lowered position in which the suction cups 131 are engageable with the top plate of the stack to grip the plate (FIG. 23B). Downward movement of the gripper mechanism 55 triggers a proximity switch to actuate the blowers 97 to blow a stream of air under the top plate of the stack to facilitate separation of the top plate from the stack. After the suction cups have established a vacuum grip on the top plate (as sensed by a suitable vacuum sensor, for example), the cylinders 133 are actuated to raise the gripper mechanism and the top plate (FIG. 23C). When the gripper mechanism arrives at its fully raised position (as sensed by the sensed by the aforementioned proximity switch, for example), the carriage cylinder 119 is actuated to move the carriage 101 to deliver the plate to the inlet end of the roller conveyor 161 (FIG. 23D). When the carriage 101 has moved to a position above the infeed end of the conveyor 161, as sensed by a suitable Reed switch on the carriage cylinder 119, the vacuum to the suction cups 131 is cut off, causing the plate P to drop onto the roller conveyor 161 which then conveys the plate to the downstream end of the conveyor where the leading edge of the plate engages the fixed stop pins 185 (FIG. 23E). The downstream lateral stop 271 is in its retracted position so that it cannot possibly interfere with the travel of the plate as it moves therepast. The arrival of the plate at the fixed stop pins 185 is detected by the photosensor 193. This detection causes the upstream stop pins 176 to move to their up position.

Figure 23F:
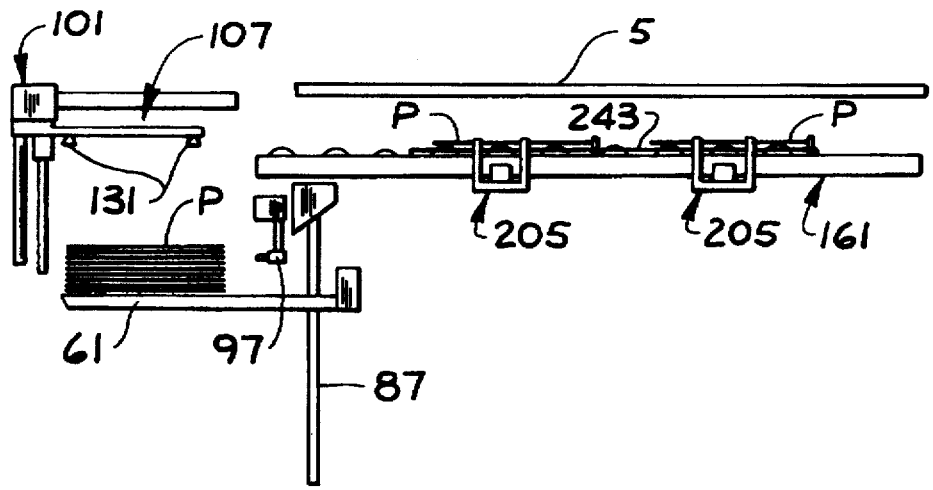
Figure 23G:
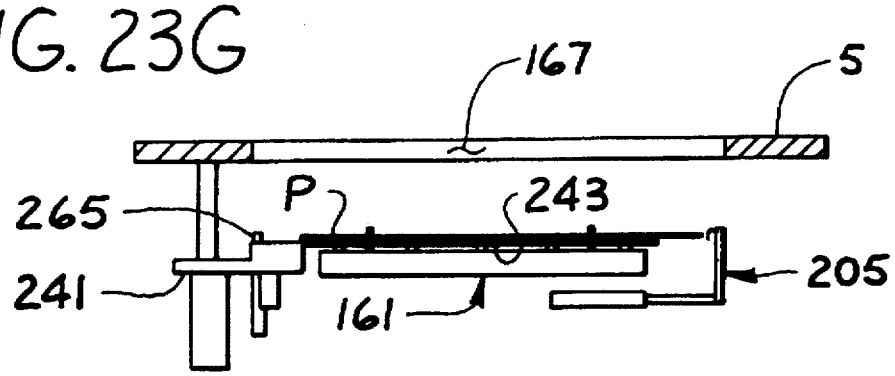
Figure 23H:
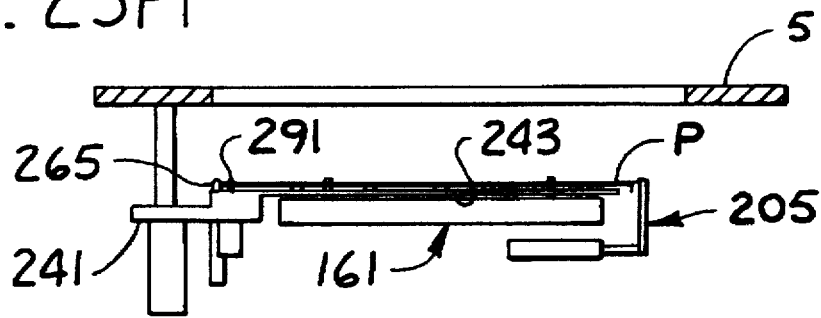
Figure 23I:
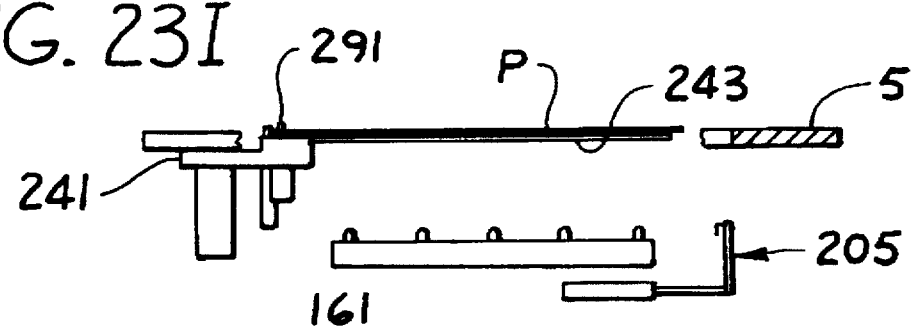

As the first single-page plate is conveyed along the roller conveyor 161, the gripper mechanism carriage 101 returns to its home position and picks up a second single-page plate P and delivers it to the roller conveyor for conveyance to a point where the leading edge of the plate engages the upstream stop pins 187 (now up) (FIG. 23F). The arrival of the second plate into position is detected by photosensor 201, which causes the downstream lateral stop 271 to move laterally inwardly toward the roller conveyor 161 and both lateral stop members 265, 271 to move up to their raised positions. A first timer is also activated to time out a first predetermined interval, after which the pusher cylinders 221 are actuated to cause the pushers 205 to move inwardly to push the two plates P on the conveyor against respective stop members 265, 271 so that they are precisely positioned at their lifting stations 163 (FIG. 23H). A second timer is also activated to time out a second predetermined interval. At the end of this second interval, the registration pin cylinders 293 are actuated to raise the registration pins 291 to extend up through registration holes in the plates to hold them in their precise positions, the pusher cylinders 221 are actuated to retract the pushers 205, and a third timer is activated to time out a third predetermined interval. At the end of this interval, the plate lift cylinder 249 is activated to raise the lift plate 243 up to its elevated position (FIG. 23I) in which the two plates on the lift plate are generally coplanar with the top of the table 5. Movement of the lift plate 243 away from its lowered position trips a Reed switch on the plate lift cylinder 249, which deenergizes the roller conveyor motor 179. Actuation of this Reed switch also causes the upstream stops 187 and lateral stops 265, 271 to move to their down positions, and the downstream lateral stop 271 to move to its retracted position.

The arrival of the lift plate 243 at its elevated position triggers a second Reed switch on the lift plate cylinder 249, causing the suction cups 31 on the infeed carriage 21 to move down to pick up the two precisely positioned plates P and to carry them, along with a pair of films F, to the exposure station 25. Movement of the infeed carriage 21 toward the exposure station trips a proximity switch which causes the lift plate cylinder 249 to move the lift plate 243 back down to its lowered position. The aforementioned Reed switch is activated when the lift plate arrives at its lowered position to actuate the registration pin cylinders 293 to lower the registration pins 291 and to activate a fourth timer for timing out a fourth interval following which the roller conveyor motor 179 is energized. The cycle then repeats.

When the desired number of plates have been exposed, the processor may be deactivated to stop further operation of the infeed carriage 21 and exposer. When this happens, the transfer mechanism 55 and conveyor 161 preferably continue to function to ensure that two plates are loaded and properly positioned on the roller conveyor in preparation for the next period of operation.

Optionally, the machine can be operated to run plates P on only one exposure line (downstream exposure line 1R). In this mode, the infeed carriage 21 picks up only one of the single-page plates (the downstream plate) on the lift plate 243 for delivery to the exposure station 25, leaving the other (upstream) plate on the lift plate. The sequence for this mode of operation is substantially identical to that described above except that when the lift plate moves back down to its lowered position (still carrying a plate on the upstream half of the lift member 243), the registration pin cylinders 293 are actuated to move the registration pins 291 to their down position, and the fourth timer is started to time out the fourth predetermined time interval, following which the roller conveyor motor 179 is energized to feed the plate still on the lift plate 243 to a downstream position abutting the fixed stop pins 185 at the downstream end of the conveyor. A second plate P is then loaded into the upstream position on the roller conveyor 161, as described above. After the positioning and registration process is repeated for both plates, they are raised by the lift member 243 up to an elevated position so that the infeed carriage 21 can grip the downstream plate and carry it to the exposure station.

As another option, the machine can be operated in conventional fashion without using the transfer mechanism 55 and conveyor system 53 of the present invention. To permit this, when the system is deactivated, the registration cylinders 293 are automatically activated to raise the registration pins 291 to their up positions, and the lift plate cylinder 249 is activated to raise the lift plate 243 to its elevated position in which its top surface is generally coplanar with the top surface of the table 5 so that a selected number of plates P (e.g., up to 50) can be loaded on the registration pins 291 for operation of the machine in a conventional mode as described in the aforementioned co-assigned patents.

It will be observed from the foregoing that apparatus which includes the plate delivery system of the present invention can operate automatically for long periods of time without having to replenish the supply of plates. This reduces the amount of time during which an operator must be present to operate the machine, thereby reducing costs.

Also, the machine can be used in various ways. For example, plates can be loaded in conventional fashion from the infeed end 7 of the machine, and the automatic plate delivery system of the present invention can be used to deliver plates from the side of the machine as needed.

As partially illustrated in FIG. 3, the machine is enclosed by suitable covers and the like. The transfer mechanism 55 is preferably enclosed by a housing (not shown) the interior of which is accessible through a door for loading a stack of plates on the tines 61, maintenance of parts, etc.

In view of the above, it will be seen that the several objects of the invention are achieved and other advantageous results attained.

As various changes could be made in the above constructions and methods without departing from the scope of the invention, it is intended that all matter contained in the above description and shown in the accompanying drawings shall be interpreted as illustrative and not in a limiting sense.

What is claimed is:

1. Apparatus for exposing photosensitized plates to light through films, said apparatus having an infeed end, an outfeed end forward of the infeed end, opposite sides, an exposure station forward of the infeed end at which a plate is exposed to light through a film, and an infeed carriage for carrying plates and films in a forward direction from a loading station at the infeed end of the machine to the exposure station, said loading station being adapted for receiving plates and films loaded by an operator from the infeed end of the apparatus, wherein the improvement comprises an automated side-loading system for delivering plates from one side of the apparatus to the loading station, said side-loading system comprising:

a support for supporting a stack of plates at said one side of the apparatus generally adjacent the infeed end of the apparatus;

a conveyor system for conveying a plate in side-to-side direction with respect to the apparatus from said one side of the apparatus to said loading station; and a transfer mechanism for removing a top plate from said stack of plates and transferring it to said conveyor system for conveyance to said loading station, said apparatus thus being selectively loadable with plates either from the infeed end of the apparatus by an operator or from said one side of the apparatus by said automated side-loading system.

2. Apparatus as set forth in claim 1 wherein said support has a capacity for supporting more than 1000 plates, and wherein said automated side-loading system further comprises an elevator mechanism for raising the support as plates are removed from the stack of the plates thereby to maintain the top of the stack at a relatively constant elevation.

3. Apparatus as set forth in claim 1 wherein said transfer mechanism comprises a transfer carriage adjacent the infeed end of the apparatus movable in side-to-side direction with respect to the apparatus, and a gripper mechanism on the transfer carriage movable up and down relative to the stack for gripping the top plate of the stack, said transfer carriage being operable to carry a plate gripped by the gripper mechanism along a horizontal path to said conveyor system.

4. Apparatus as set forth in claim 3 further comprising a main frame, and track means projecting generally horizontally and laterally from the main frame at said one side of the apparatus, said transfer carriage being movable back and forth on the track means.

5. Apparatus as set forth in claim 1 further comprising a blower for blowing air under the top plate of the stack of plates thereby to facilitate separation of the top plate from the stack.

6. Apparatus for exposing photosensitized plates to light through films, said apparatus having an infeed end, an outfeed end forward of the infeed end, opposite sides, an exposure station forward of the infeed end at which a plate is exposed to light through a film, and an infeed carriage for carrying plates and films in a forward direction from a loading station at the infeed end of the apparatus to the exposure station, said apparatus further comprising a main frame, wherein the improvement comprises:

a support for supporting a stack of plates at one side of the apparatus generally adjacent the infeed end of the apparatus;

a conveyor system for conveying a plate in side-to-side direction with respect to the apparatus from said one side of the apparatus to said loading station; and a transfer mechanism for removing a top plate from said stack of plates and transferring it to said conveyor system for conveyance to said loading station;

said transfer mechanism comprising track means projecting generally horizontally and laterally from the main frame at said one side of the apparatus, a transfer carriage adjacent the infeed end of the apparatus movable in movable back and forth on the track means in side-to-side direction with respect to the apparatus, and a gripper mechanism on the transfer carriage movable up and down relative to the stack for gripping the top plate of the stack, said transfer carriage being operable to carry a plate gripped by the gripper mechanism to said conveyor system;

said conveyor system comprising a conveyor for receiving a plate from said transfer mechanism and conveying it in side-to-side direction with respect to said apparatus to a lift station below said loading station, and a lift mechanism for raising a plate at said lift station up to the loading station for delivery of the plate to the exposure station by said infeed carriage.

7. Apparatus as set forth in claim 6 further comprising positioning means for moving a plate with respect to said conveyor to a precise position at said lift station, and registration pins on said lift mechanism movable into registration holes in a plate at said lift station for holding the plate in said precise position as it is raised to said loading station.

8. Apparatus as set forth in claim 7 wherein said positioning means further comprises first stop means engageable by the plate as it is conveyed by the conveyor in said side-to-side direction thereby to position the plate in side-to-side direction with respect to the apparatus, second stop means at one side of the conveyor, and a pusher for pushing the plate in an end-to-end direction with respect to the apparatus against said second stop means thereby to position the plate in end-to-end direction with respect to the apparatus.

9. Apparatus as set forth in claim 8 wherein said second stop means comprises a movable stop movable between a retracted position in which it is clear of a plate being conveyed by said conveyor, and an extended position in which it is engageable by said plate when the plate is pushed by said pusher means, said movable stop being movable to its extended position after said plate has engaged said first stop means.

10. Apparatus as set forth in claim 6 wherein said conveyor comprises a plurality of rotatable rollers engageable with the underside of a plate, and wherein said lift mechanism comprises a lift member having openings therein for receiving said rollers, and a power actuator for moving the lift member between a lowered position in which the lift member is disposed at an elevation below the tops of said rollers and in which the tops of the rollers project up through said openings in the lift member, and an elevated position for supporting a plate at said loading station.

11. Apparatus as set forth in claim 10 wherein said main frame comprises a table having an opening therein at said loading station directly above said lift station, said opening being sized to receive said lift member therein.

12. Apparatus for exposing photosensitized plates to light through films, said apparatus having an infeed end, an outfeed end forward of the infeed end, opposite sides, an exposure station forward of the infeed end at which a plate is exposed to light through a film, and an infeed carriage for carrying plates and films in a forward direction from a loading station at the infeed end of the machine to the exposure station, wherein the improvement comprises:

a support for supporting a stack of plates at one side of the apparatus generally adjacent the infeed end of the apparatus;

a conveyor system for conveying a plate in side-to-side direction with respect to the apparatus from said one side of the apparatus to said loading station; and a transfer mechanism for removing a top plate from said stack of plates and transferring it to said conveyor system for conveyance to said loading station;

said conveyor system comprising a conveyor for receiving a plate from said transfer mechanism and conveying it in side-to-side direction with respect to said apparatus to a lift station below said loading station, and a lift mechanism for raising a plate at said lift station up to the loading station for delivery of the plate to the exposure station by said infeed carriage.

13. Apparatus as set forth in claim 12 further comprising positioning means for moving a plate with respect to said conveyor to a precise position at said lift station, and registration pins on said lift mechanism movable into registration holes in a plate at said lift station for holding the plate in said precise position as it is raised to said loading station.

14. Apparatus as set forth in claim 13 wherein said positioning means further comprises first stop means engageable by the plate as it is conveyed by the conveyor in said side-to-side direction thereby to position the plate in side-to-side direction with respect to the apparatus, second stop means at one side of the conveyor, and a pusher for pushing the plate in an end-to-end direction with respect to the apparatus against said second stop means thereby to position the plate in end-to-end direction with respect to the apparatus.

15. Apparatus as set forth in claim 14 wherein said second stop means comprises a movable stop movable between a retracted position in which it is clear of a plate being conveyed by said conveyor, and an extended position in which it is engageable by said plate when the plate is pushed by said pusher means, said movable stop being movable to its extended position after said plate has engaged said first stop means.

16. Apparatus as set forth in claim 12 wherein said conveyor comprises a plurality of rotatable rollers engageable with the underside of a plate, and wherein said lift mechanism comprises a lift member having a openings therein for receiving said rollers, and a power actuator for moving the lift member between a lowered position in which the lift member is disposed at an elevation below the tops of said rollers and in which the tops of the rollers project up through said openings in the lift member, and an elevated position for supporting a plate at said loading station.

17. Apparatus as set forth in claim 16 wherein said main frame comprises a table having an opening therein at said loading station directly above said lift station, said opening being sized to receive said lift member therein.

18. Apparatus for exposing photosensitized plates to light through films, said apparatus comprising a support for supporting a stack of plates, a transfer system for removing a top plate from said stack of plates and transferring it to a lift station for placement at the lift station in a generally horizontal orientation, a lift system for lifting the horizontal plate at said lift station to a loading station, said lift system maintaining the plate generally horizontal as the plate is lifted to said loading station, a conveyor system for conveying the horizontal plate at the loading station to an exposure station, said plate remaining generally horizontal while being so conveyed to said exposure station, and means for exposing the horizontal plate to light through a film at the exposure station.

19. Apparatus as set forth in claim 18 wherein said transfer system for removing a top plate from said stack of plates and transferring it to a lift station comprises a conveyor for conveying the plate in a first direction to said lift station, and wherein said conveyor system for conveying the plate at the loading station to an exposure station comprises an infeed carriage for carrying the plate in a second direction generally perpendicular to said first direction.

20. Apparatus as set forth in claim 19 wherein said transfer system for removing a top plate from said stack of plates and transferring it to a lift station further comprises vacuum grippers operable to grip the top plate of the stack, and a transfer carriage for carrying the plate while it is vacuum gripped to said conveyor, said vacuum grippers being operable to release the plate onto the conveyor for conveyance to the lift station.

21. Apparatus for exposing photosensitized plates to light through films, said apparatus comprising a support for supporting a stack of plates, a transfer system for removing a top plate from said stack of plates and transferring it to a lift station, a lift system for lifting the plate at said lift station to a loading station, a conveyor system for conveying the plate at the loading station to an exposure station, and means for exposing the plate to light through a film at the exposure station;

said transfer system comprising a conveyor for conveying the plate in a first direction to said lift station, and said conveyor system comprising an infeed carriage for carrying the plate in a second direction generally perpendicular to said first direction;

said transfer system further comprising vacuum grippers operable to grip the top plate of the stack, and a transfer carriage for carrying the plate while it is vacuum gripped to said conveyor, said vacuum grippers being operable to release the plate onto the conveyor for conveyance to the lift station; said apparatus further comprising a system for moving a plate at the lift station to a precise position directly below said loading station, and registration pins receivable in registration openings in the plate for holding the plate in said precise position as it is lifted to the loading station.

22. A method of exposing photosensitized plates to light through films, said method comprising the steps of (a) placing a stack of said plates on a support so that the plates are held by the support in a generally horizontal orientation, (b) removing a top plate from said stack of plates and transferring it to a lift station for placement at the lift station in a generally horizontal orientation, (c) lifting the horizontal plate at said lift station to a loading station while maintaining the plate generally horizontal, (d) conveying the horizontal plate at the loading station to an exposure station while maintaining the plate generally horizontal, and (e) exposing the horizontal plate to light through a film at the exposure station.

23. A method as set forth in claim 22 wherein step (b) involves transferring the plate by conveying it in a first direction, and wherein step (d) involves conveying the plate in a second direction generally perpendicular to said first direction.

24. A method as set forth in claim 22 wherein step (b) involves vacuum gripping said top plate to remove it from said stack, carrying the plate while it is vacuum gripped to a conveyor, placing the plate on the conveyor, and operating the conveyor to convey the plate to the lift station.

25. A method of exposing photosensitized plates to light through films, said method comprising the steps of (a) placing a stack of said plates on a support, (b) removing a top plate from said stack of plates and transferring it to a lift station by conveying the plate in a first direction, moving a plate at the lift station to a precise position directly below a loading station, and using registration pins to hold the plate in said precise position while it is lifted to the loading station, (c) lifting the plate at said lift station to the loading station, (d) conveying the plate at the loading station in a second direction generally perpendicular to said first direction to an exposure station, and (e) exposing the plate to light through a film at the exposure station.

* * * * *